US012787418B2

(12) United States Patent
Zhang et al.

(10) Patent No.: US 12,787,418 B2
(45) Date of Patent: Nov. 3, 2026

(54) SEMICONDUCTOR DEVICE STRUCTURE WITH ISOLATION LAYER AND METHOD FOR FORMING THE SAME

(71) Applicant: Taiwan Semiconductor Manufacturing Company, Ltd., Hsinchu (TW)

(72) Inventors: Da-Zhi Zhang, New Taipei City (TW); Chung-Pin Huang, New Taipei City (TW); Po-Nien Chen, Miaoli County (TW); Hsiao-Han Liu, Miaoli County (TW); Jhon-Jhy Liaw, Zhudong Township, Hsinchu County (TW); Chih-Yung Lin, Hsinchu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 675 days.

(21) Appl. No.: 18/166,932

(22) Filed: Feb. 9, 2023

(65) Prior Publication Data

US 2024/0105521 A1    Mar. 28, 2024

Related U.S. Application Data

(60) Provisional application No. 63/410,372, filed on Sep. 27, 2022.

(51) Int. Cl.
*H10D 84/03* (2025.01)
*H10D 84/01* (2025.01)
*H10D 84/83* (2025.01)

(52) U.S. Cl.
CPC ....... *H10D 84/038* (2025.01); *H10D 84/0151* (2025.01); *H10D 84/0158* (2025.01); *H10D 84/834* (2025.01)

(58) Field of Classification Search
CPC ............. H10D 84/038; H10D 84/0158; H10D 84/0193; H10D 84/853; H10D 84/0151; H10D 84/0188; H10D 30/024; H10D 30/62
See application file for complete search history.

(56) References Cited

U.S. PATENT DOCUMENTS

| | | | | |
|---|---|---|---|---|
| 7,211,864 | B2 * | 5/2007 | Seliskar | H10D 30/024 257/287 |
| 7,666,723 | B2 * | 2/2010 | Frank | H10D 30/021 438/455 |
| 2016/0225906 | A1 * | 8/2016 | Wang | H10D 84/0193 |
| 2019/0067124 | A1 * | 2/2019 | Tsai | H01L 21/31053 |
| 2021/0375691 | A1 * | 12/2021 | Chen | H01L 21/76897 |
| 2022/0028971 | A1 * | 1/2022 | Rana | H01L 21/76264 |

* cited by examiner

*Primary Examiner* — Tuan A Hoang
(74) *Attorney, Agent, or Firm* — Cooper Legal Group, LLC

(57) ABSTRACT

A method for forming a semiconductor device structure is provided. The method includes providing a substrate having a base, a first fin, and a second fin over the base. The method includes forming a first trench in the base and between the first fin and the second fin. The method includes forming an isolation layer over the base and in the first trench. The first fin and the second fin are partially in the isolation layer. The method includes forming a first gate stack over the first fin and the isolation layer. The method includes forming a second gate stack over the second fin and the isolation layer. The method includes removing a bottom portion of the base. The isolation layer passes through the base after the bottom portion of the base is removed.

20 Claims, 24 Drawing Sheets

SEMICONDUCTOR DEVICE STRUCTURE WITH ISOLATION LAYER AND METHOD FOR FORMING THE SAME

PRIORITY CLAIM AND CROSS-REFERENCE

This application claims the benefit of U.S. Provisional Application No. 63/410,372, filed on Sep. 27, 2022, and entitled "SEMICONDUCTOR DEVICE STRUCTURE WITH ISOLATION LAYER AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1J are top views of various stages of a process for forming a semiconductor device structure, in accordance with some embodiments.

FIGS. 1A-1 to 1J-1 are cross-sectional views illustrating the semiconductor device structure along a sectional line I-I' in FIGS. 1A-1J, in accordance with some embodiments.

FIG. 1E-2 is a cross-sectional view illustrating the semiconductor device structure along a sectional line II-II' in FIG. 1E, in accordance with some embodiments.

FIG. 1F-2 is a cross-sectional view illustrating the semiconductor device structure along a sectional line II-II' in FIG. 1F, in accordance with some embodiments.

FIG. 1G-2 is a cross-sectional view illustrating the semiconductor device structure along a sectional line II-II' in FIG. 1G, in accordance with some embodiments.

FIG. 1H-2 is a cross-sectional view illustrating the semiconductor device structure along a sectional line II-II' in FIG. 1H, in accordance with some embodiments.

FIG. 1I-2 is a cross-sectional view illustrating the semiconductor device structure along a sectional line II-II' in FIG. 1I, in accordance with some embodiments.

FIG. 1I-3 is a cross-sectional view illustrating the semiconductor device structure along a sectional line III-III' in FIG. 1I, in accordance with some embodiments.

FIG. 1J-2 is a cross-sectional view illustrating the semiconductor device structure along a sectional line II-II' in FIG. 1J, in accordance with some embodiments.

FIG. 1J-3 is a cross-sectional view illustrating the semiconductor device structure along a sectional line III-III' in FIG. 1J, in accordance with some embodiments.

FIGS. 2A-1 to 2D-1 are cross-sectional views illustrating the semiconductor device structure along a sectional line I-I' in FIGS. 2A-2D, in accordance with some embodiments.

FIG. 2D-2 is a cross-sectional view illustrating the semiconductor device structure along a sectional line II-II' in FIG. 2D, in accordance with some embodiments.

FIG. 2D-3 is a cross-sectional view illustrating the semiconductor device structure along a sectional line III-III' in FIG. 2D, in accordance with some embodiments.

DETAILED DESCRIPTION

Figure 1A:
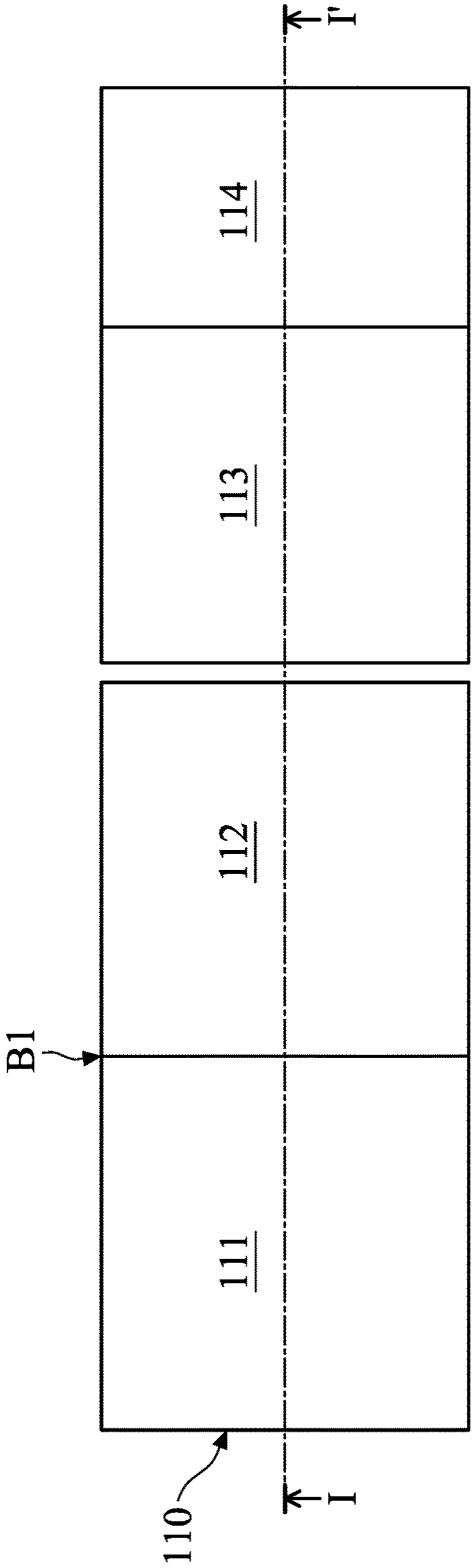

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Source/drain structure(s) may refer to a source or a drain, individually or collectively dependent upon the context.

Figures 1, 1A:
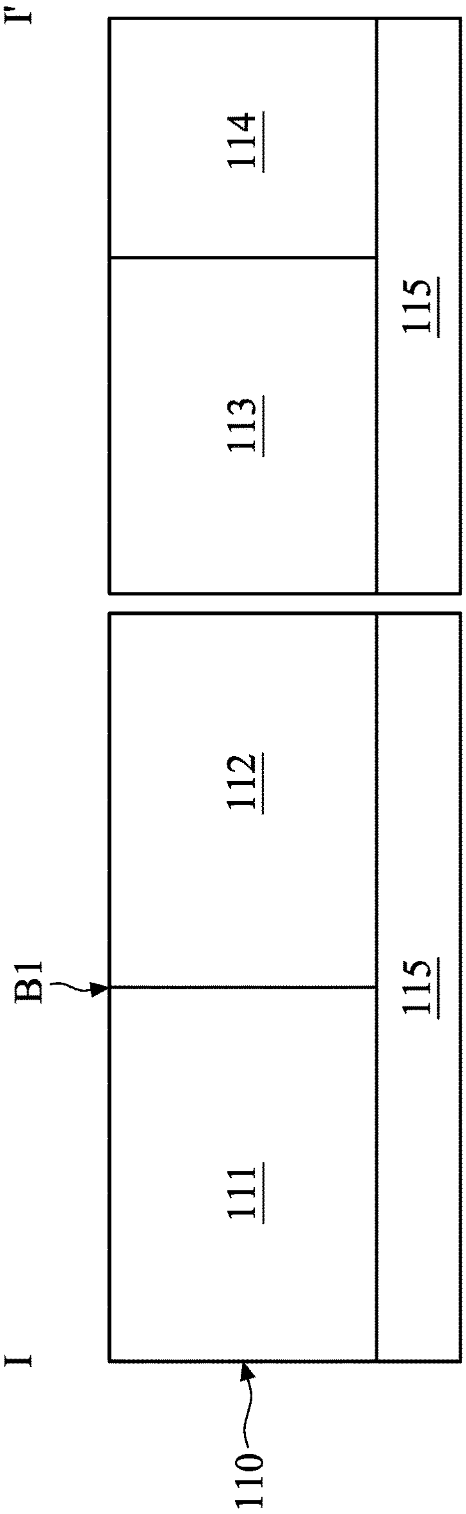
Figure 1B:
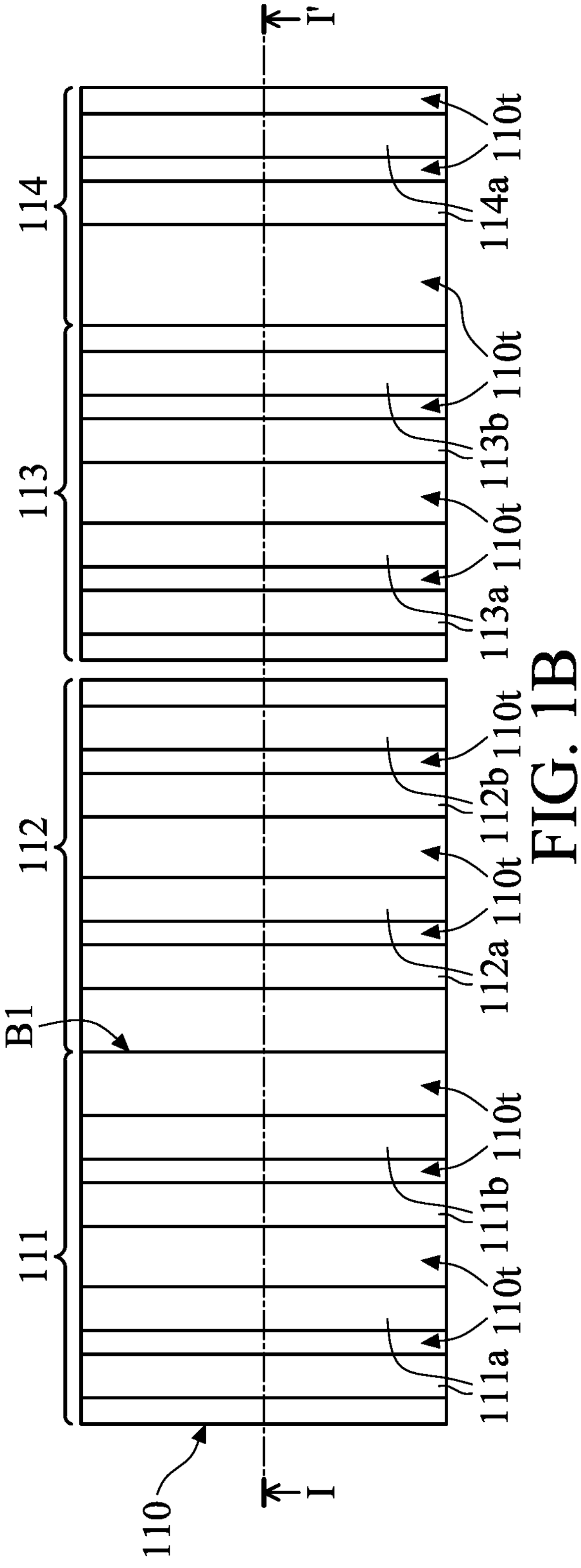
Figures 1, 1B:
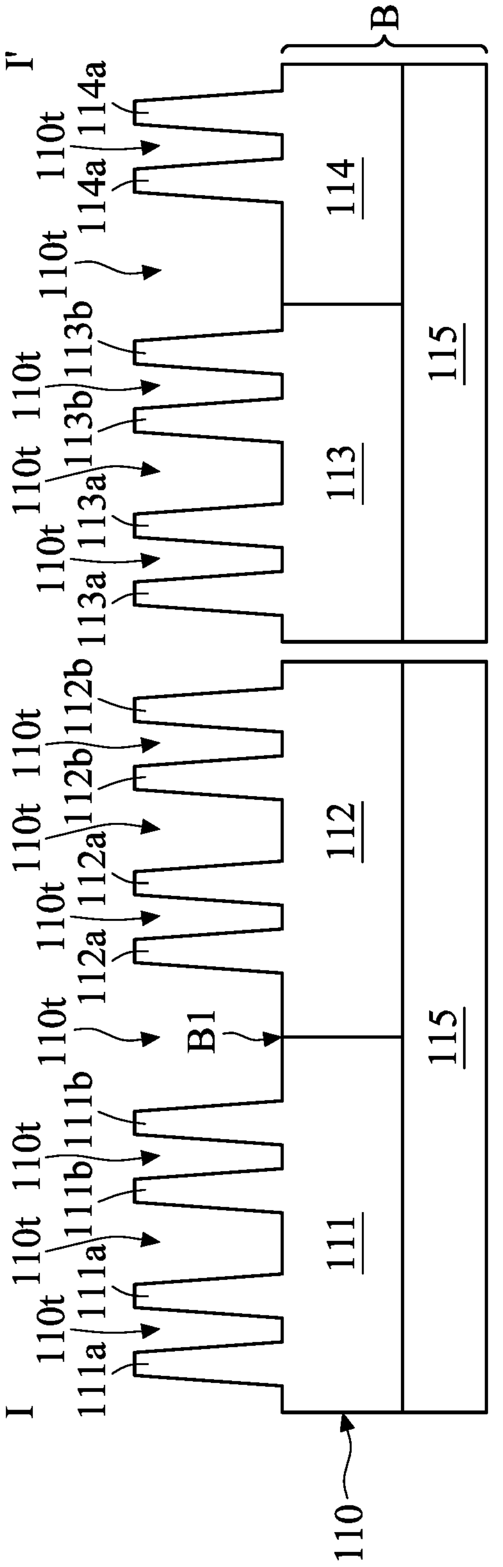
Figure 1C:
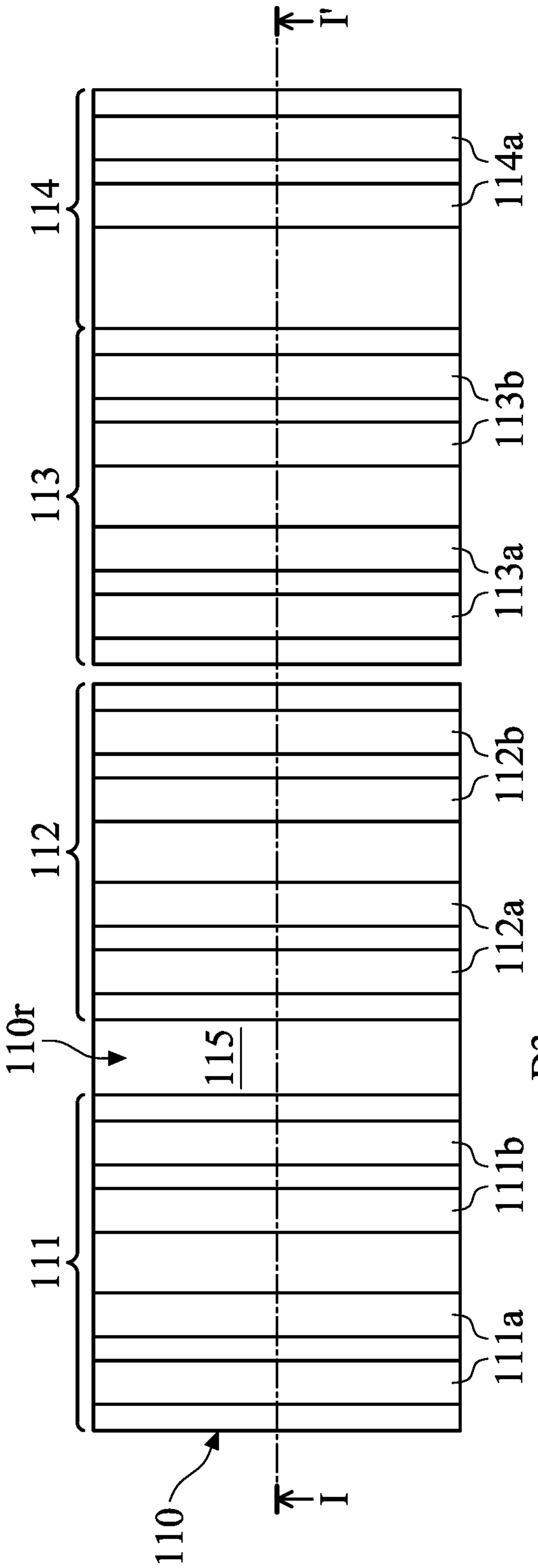
Figures 1, 1C:
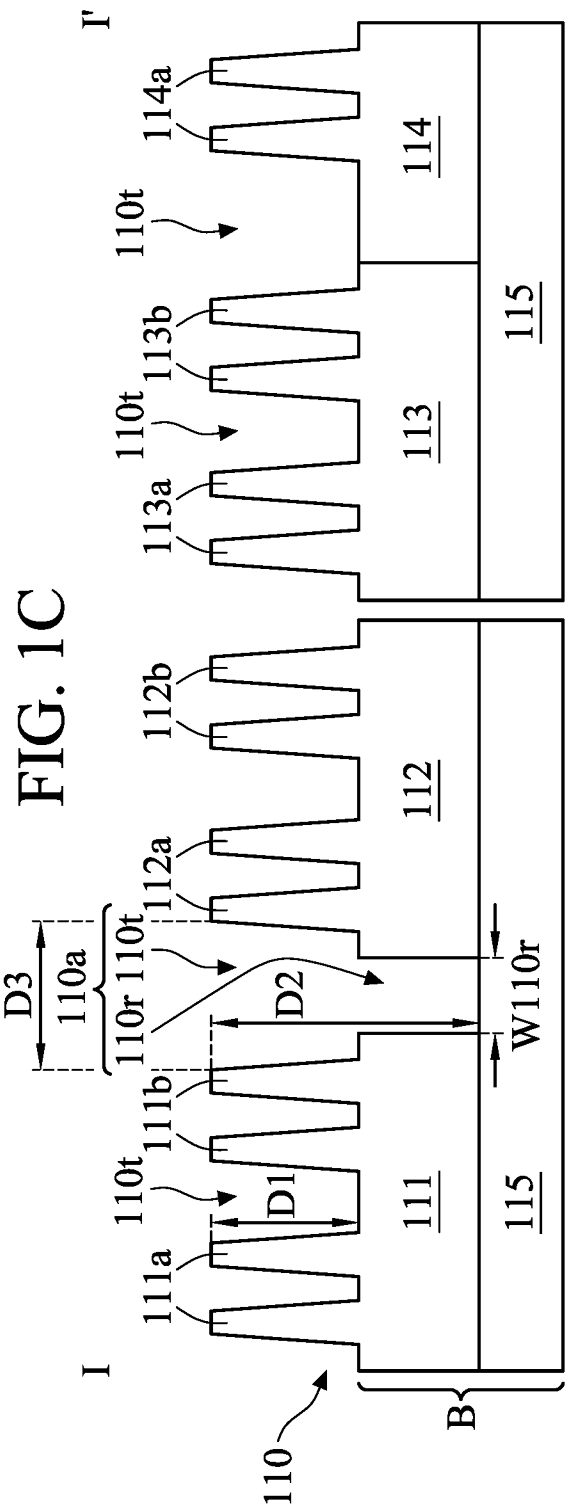
Figure 1D:
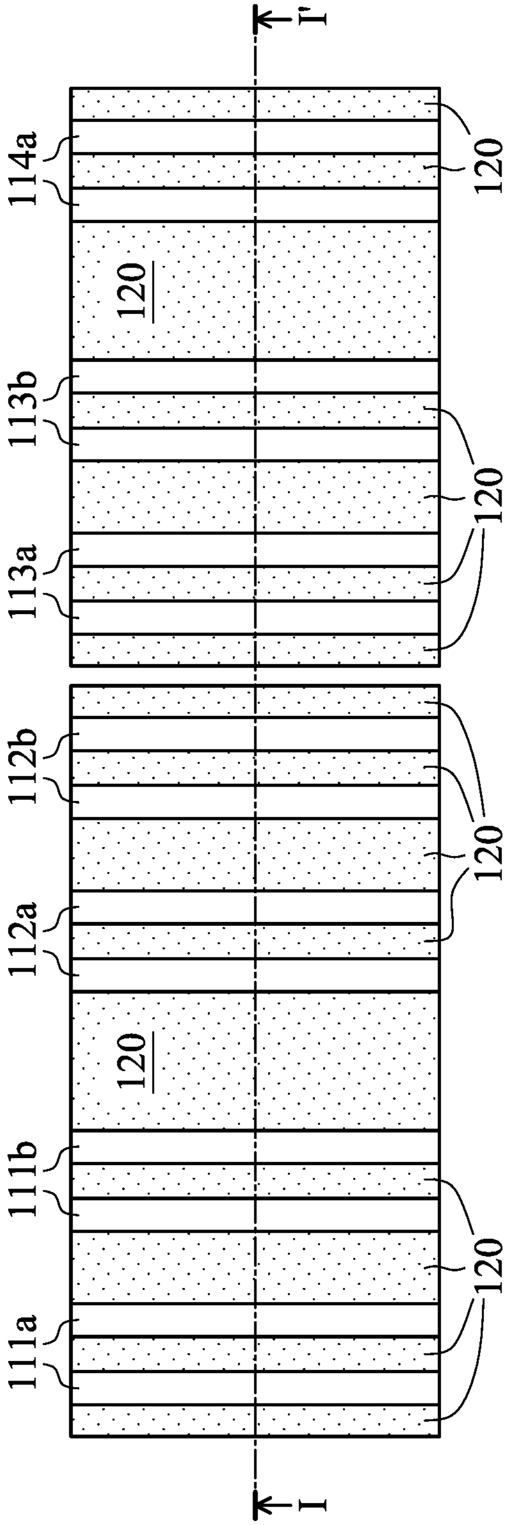
Figures 1, 1D:
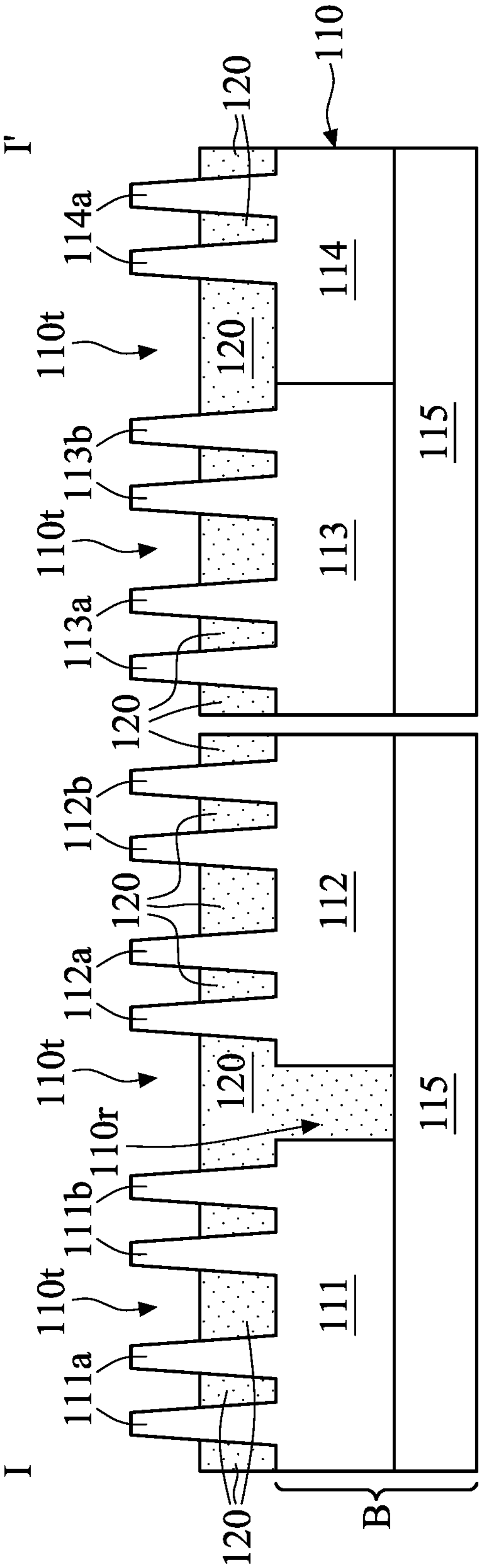
Figures 1, 1E:
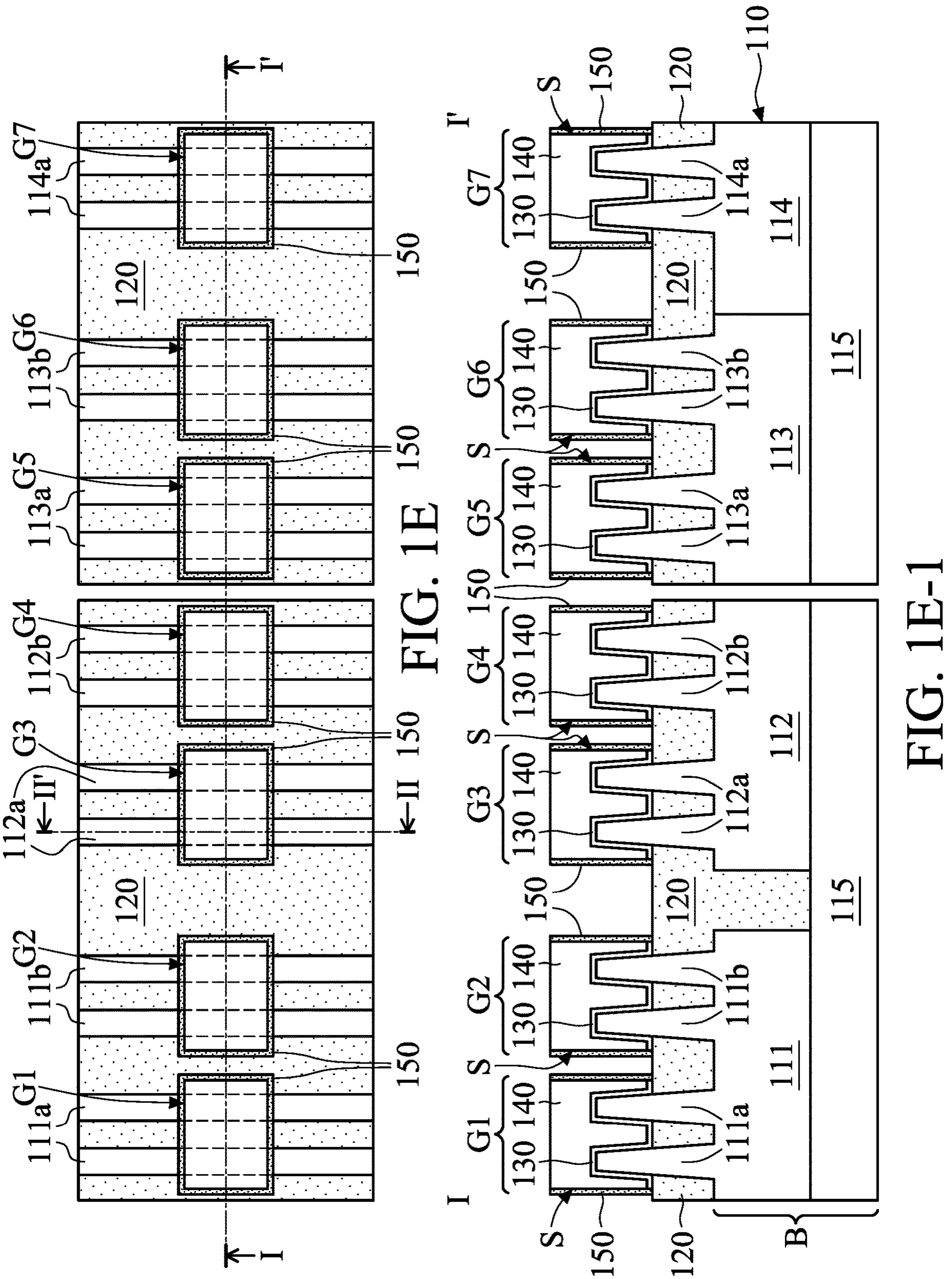
Figures 1, 1E, 2:
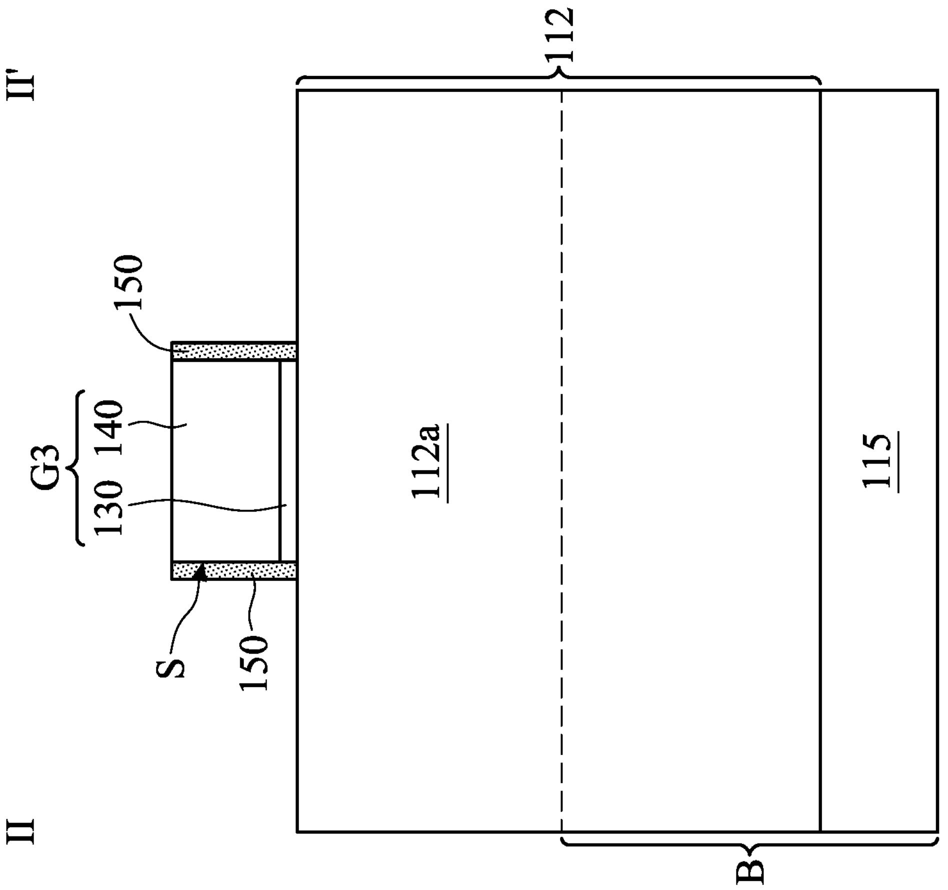
Figure 1F:
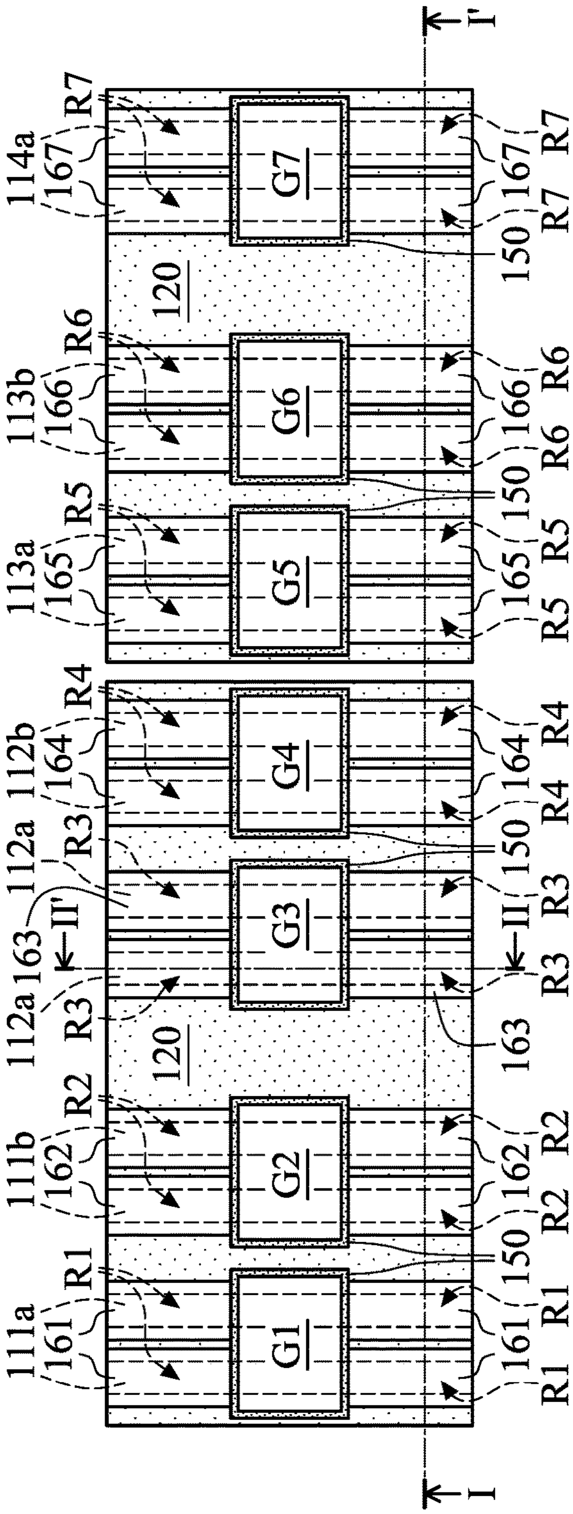
Figures 1, 1F:
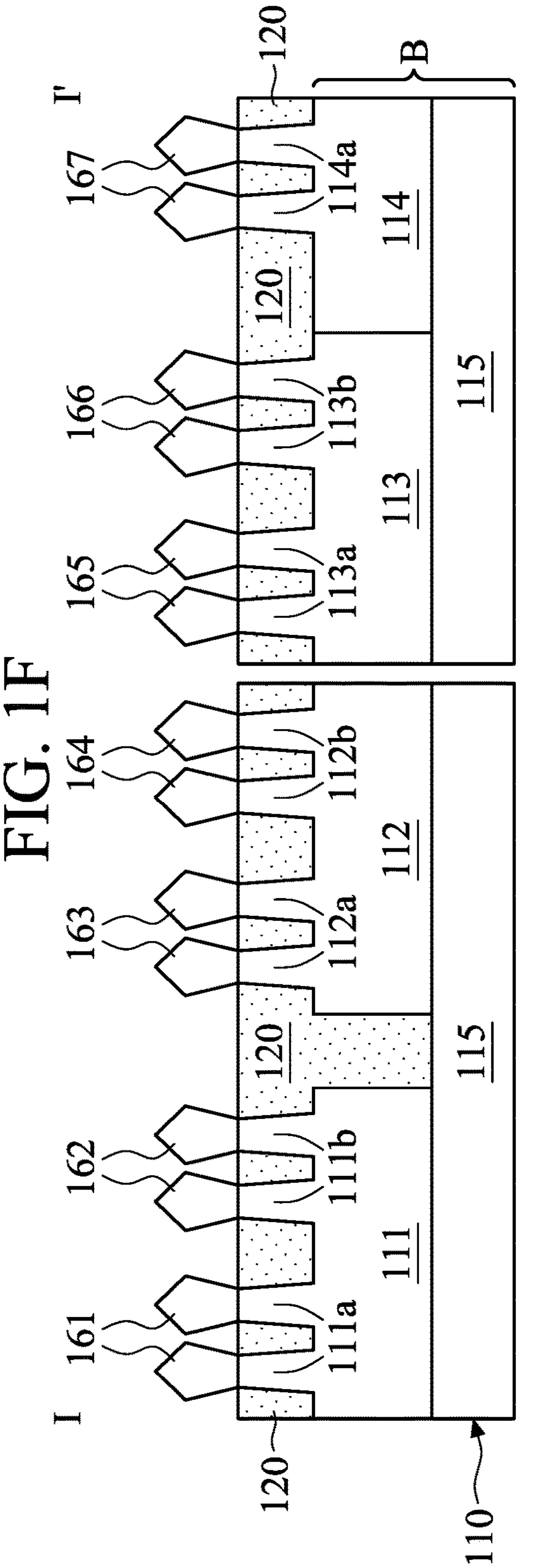
Figures 1, 1F, 2:
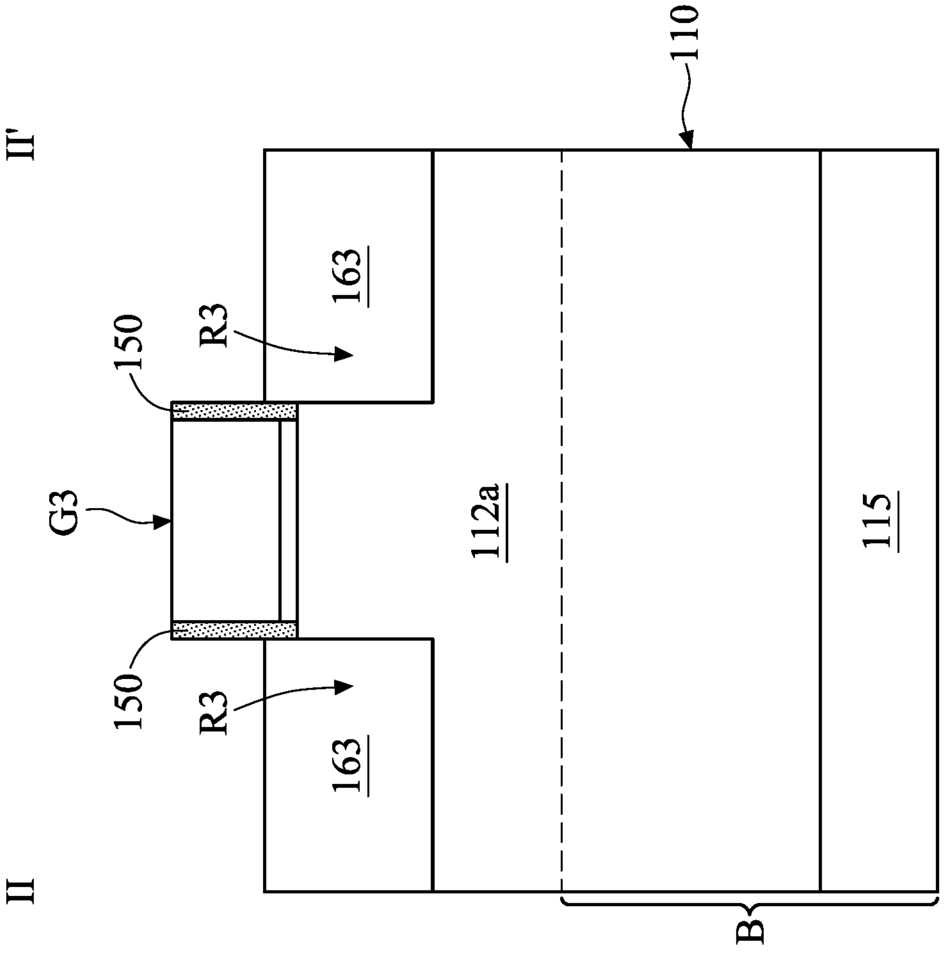
Figure 1G:
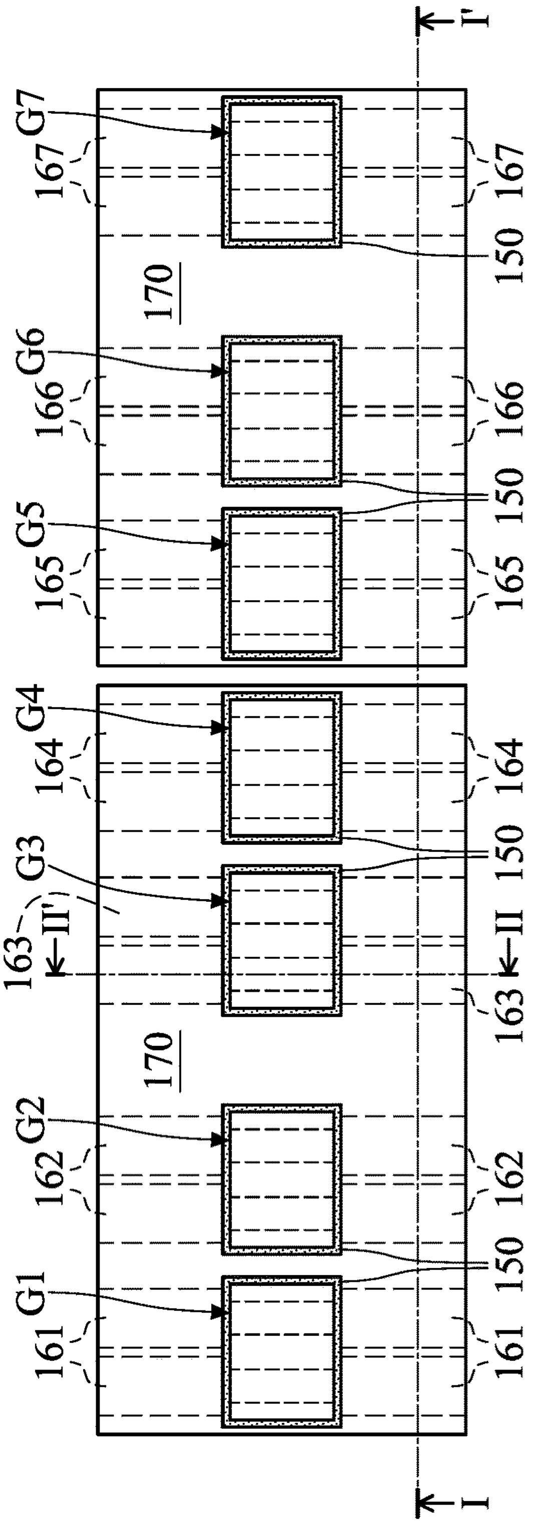
Figures 1, 1G:
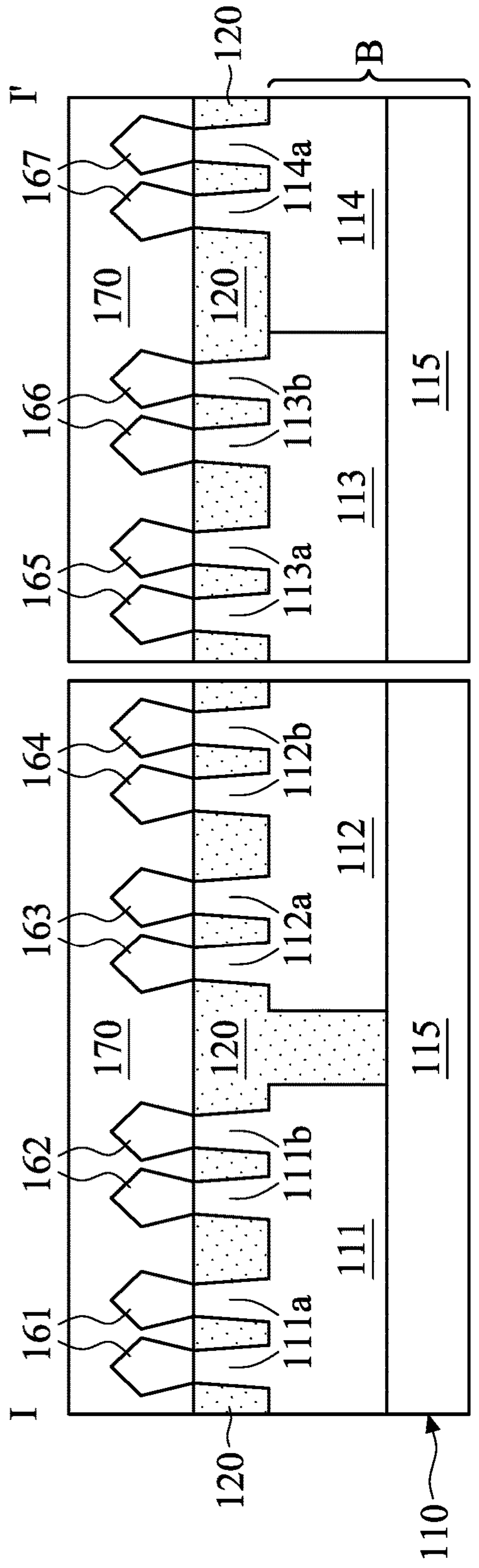
Figures 1, 1G, 2:
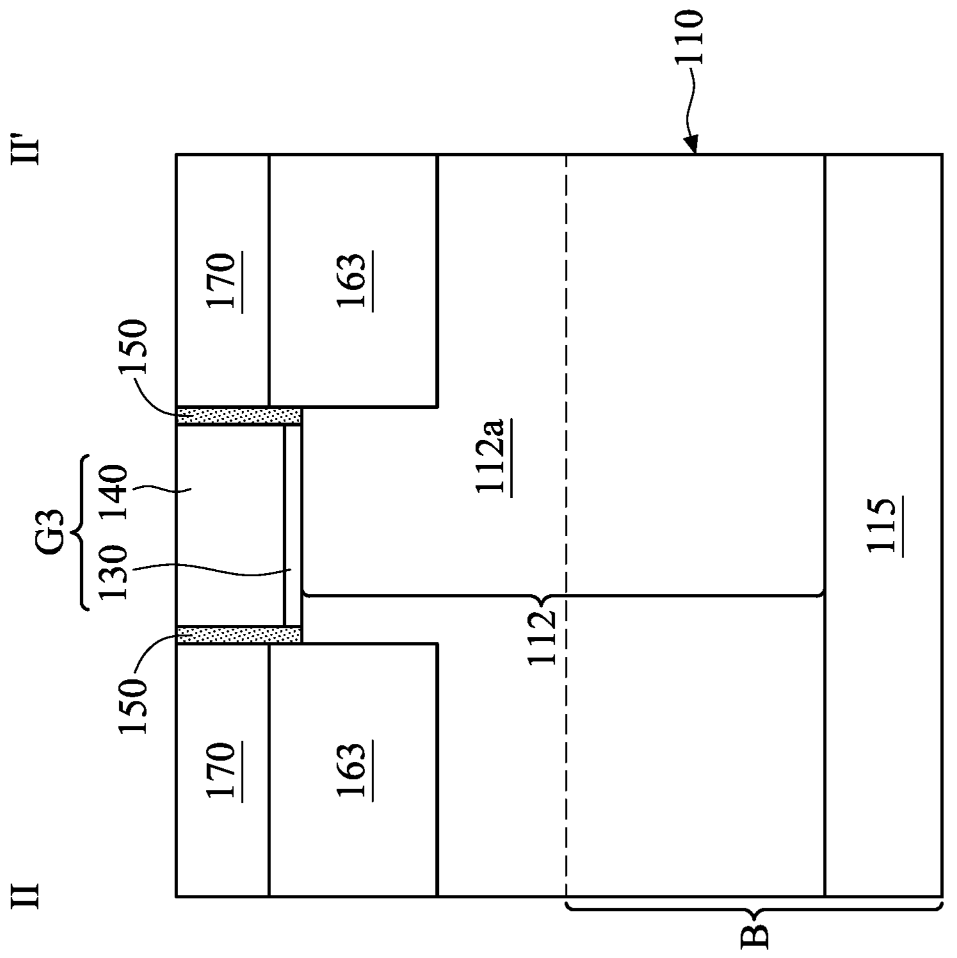
Figure 1H:
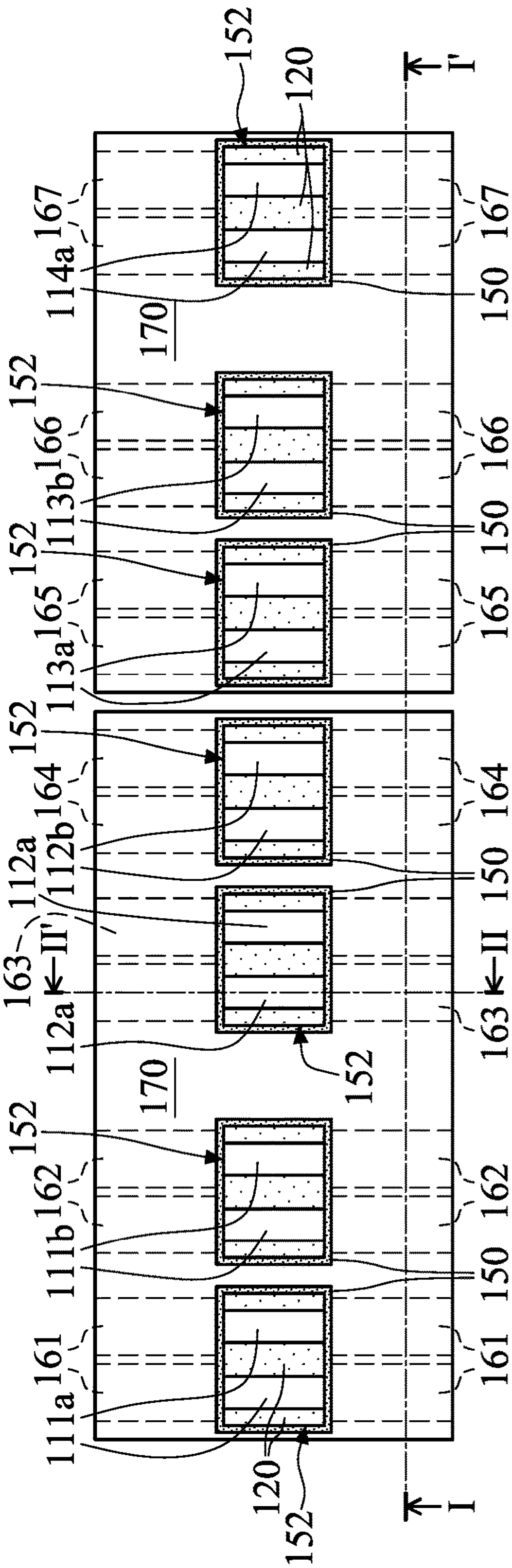
Figures 1, 1H:
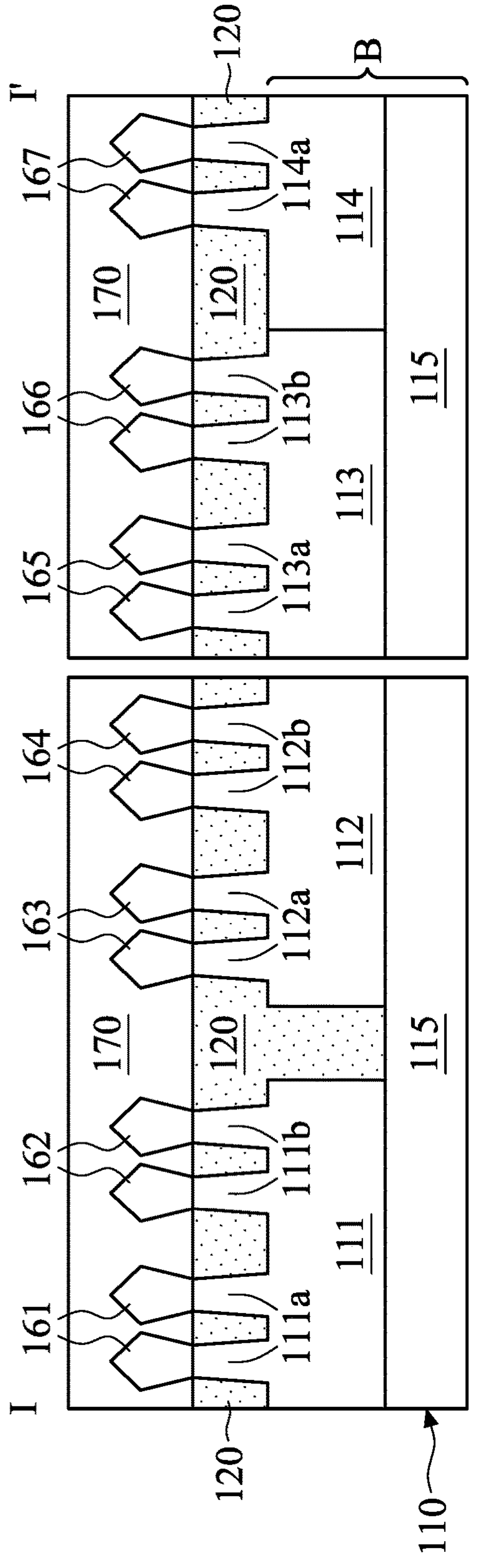
Figures 1, 1H, 2:
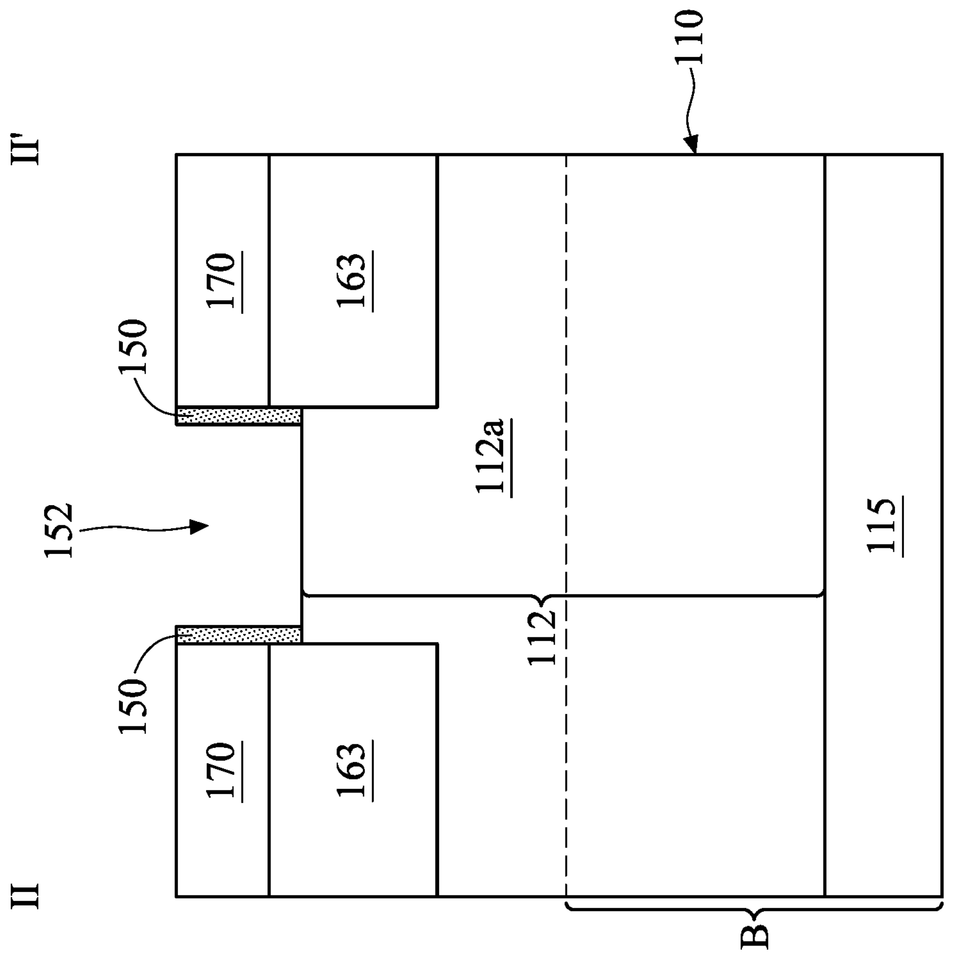
Figure 11I:
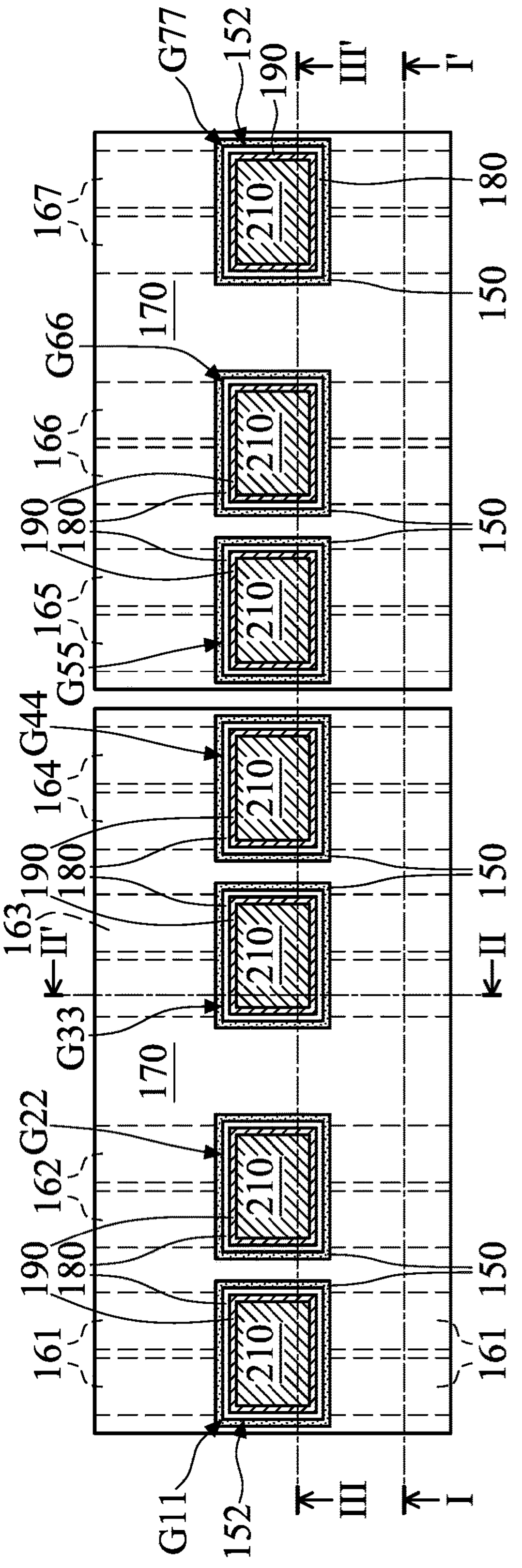
Figures 1, 11I:
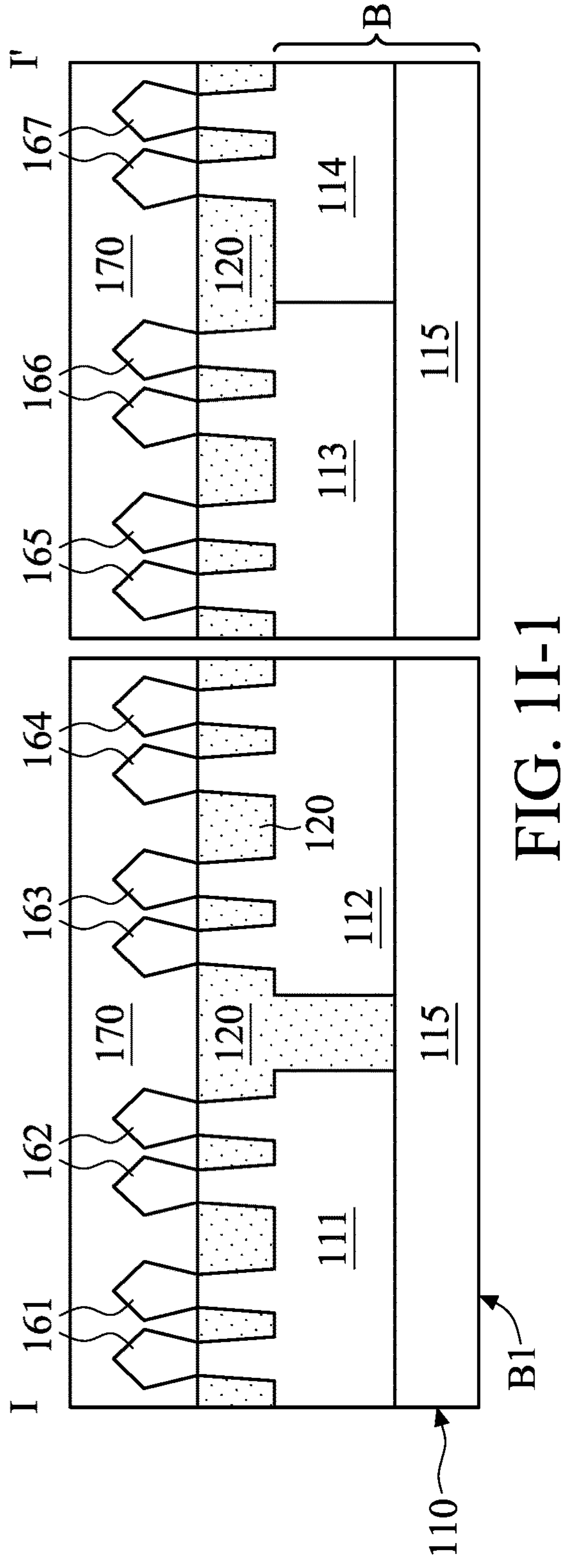
Figures 1, 1I, 2:
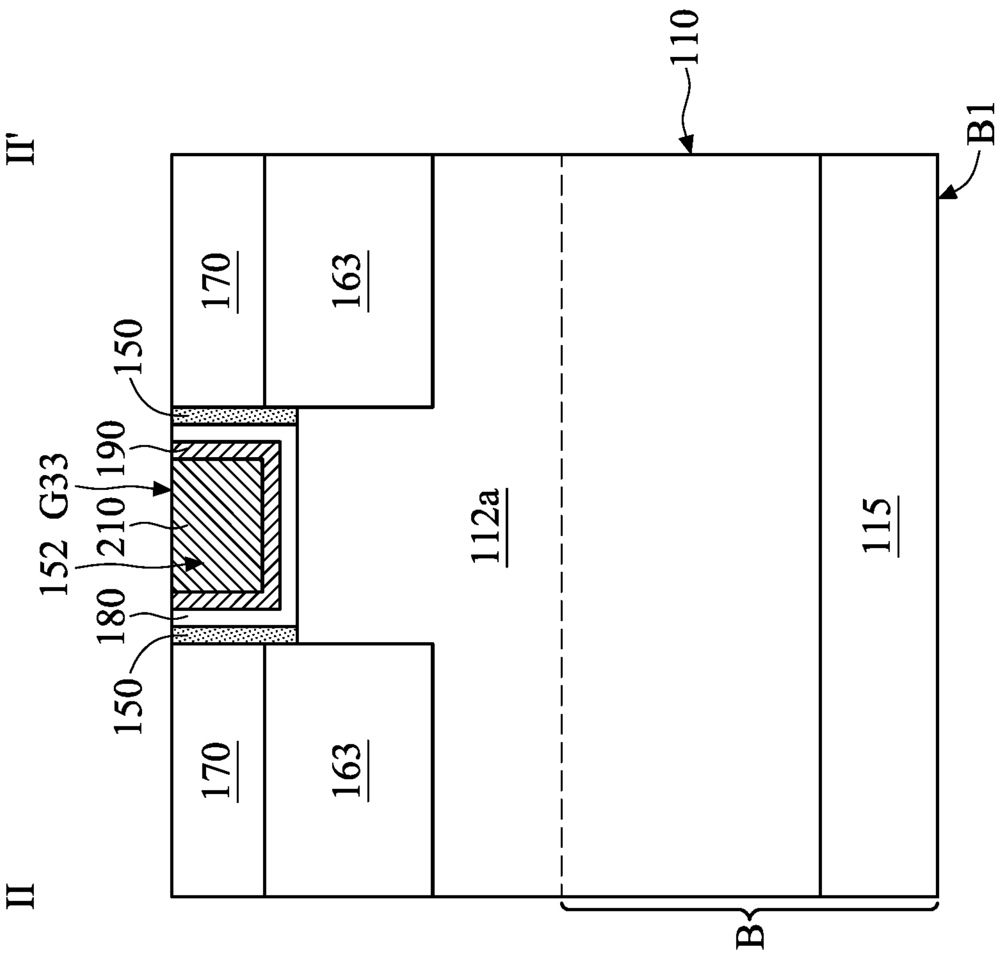
Figures 1, 1I, 2, 3:
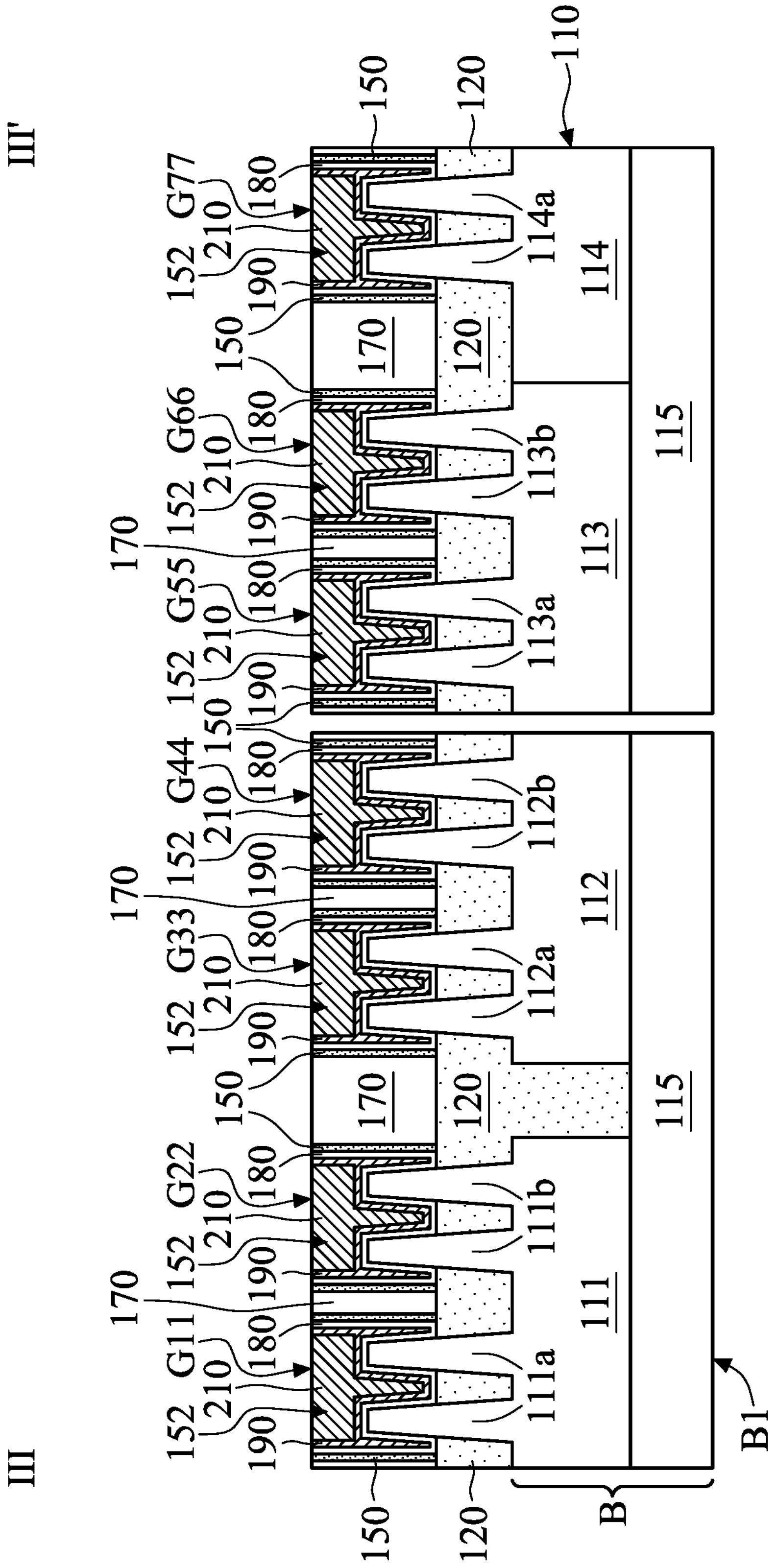
Figure 1J:
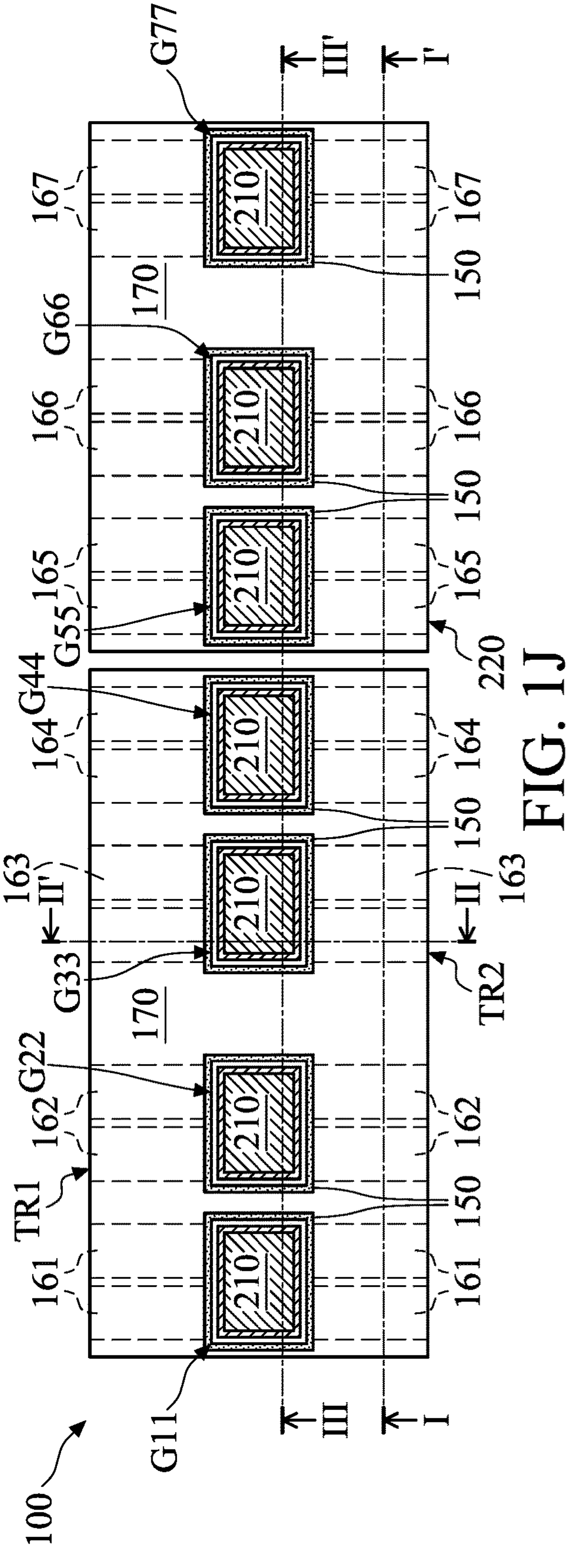
Figures 1, 1J:
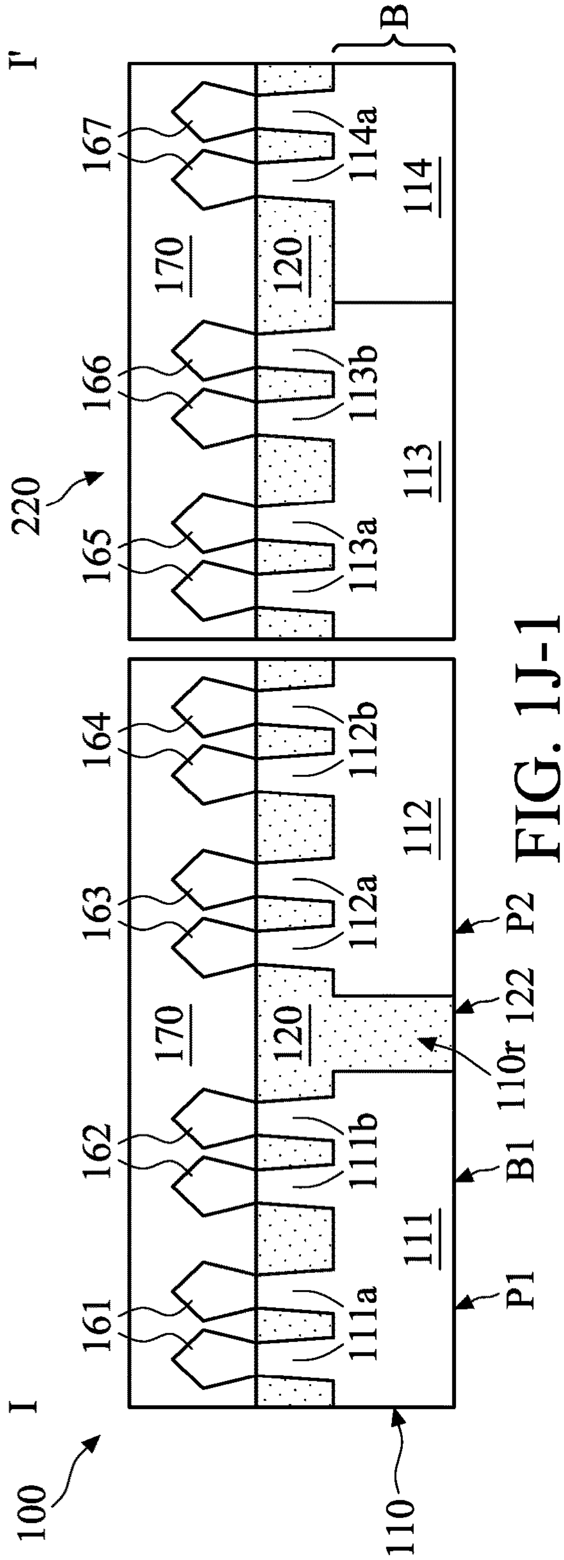
Figures 1, 1J, 2:
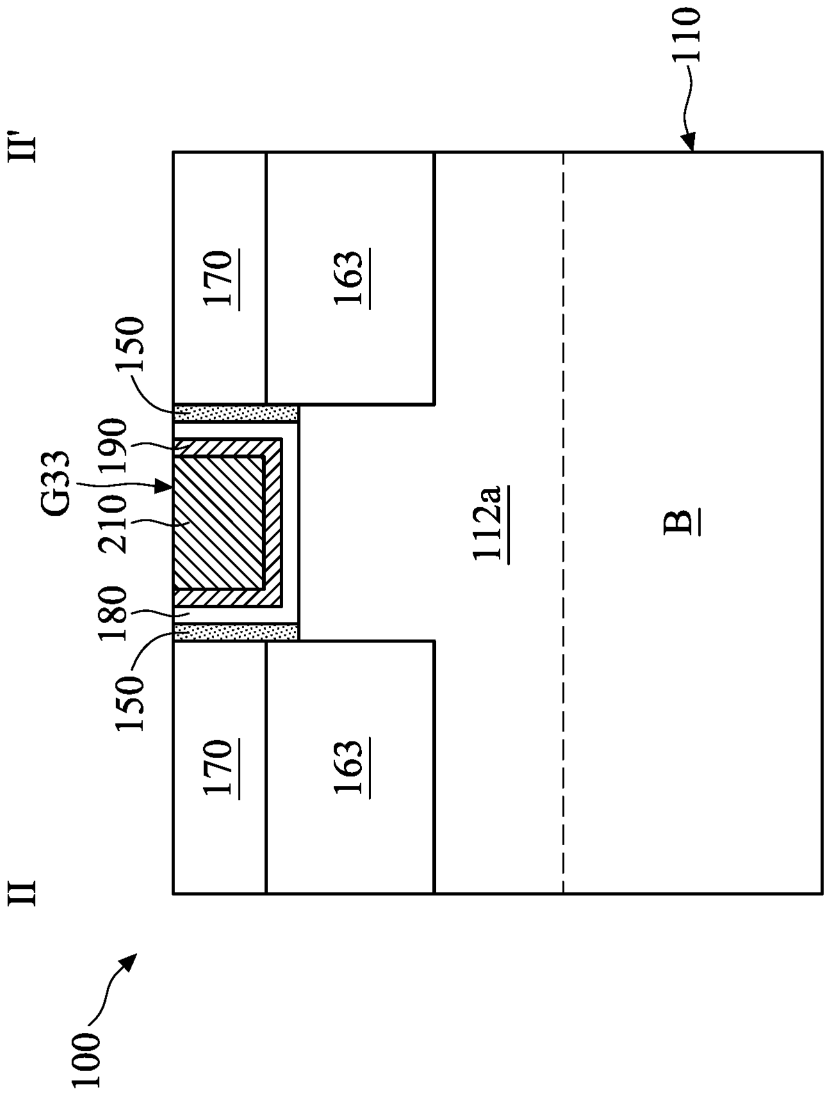
Figures 1, 1J, 2, 3:
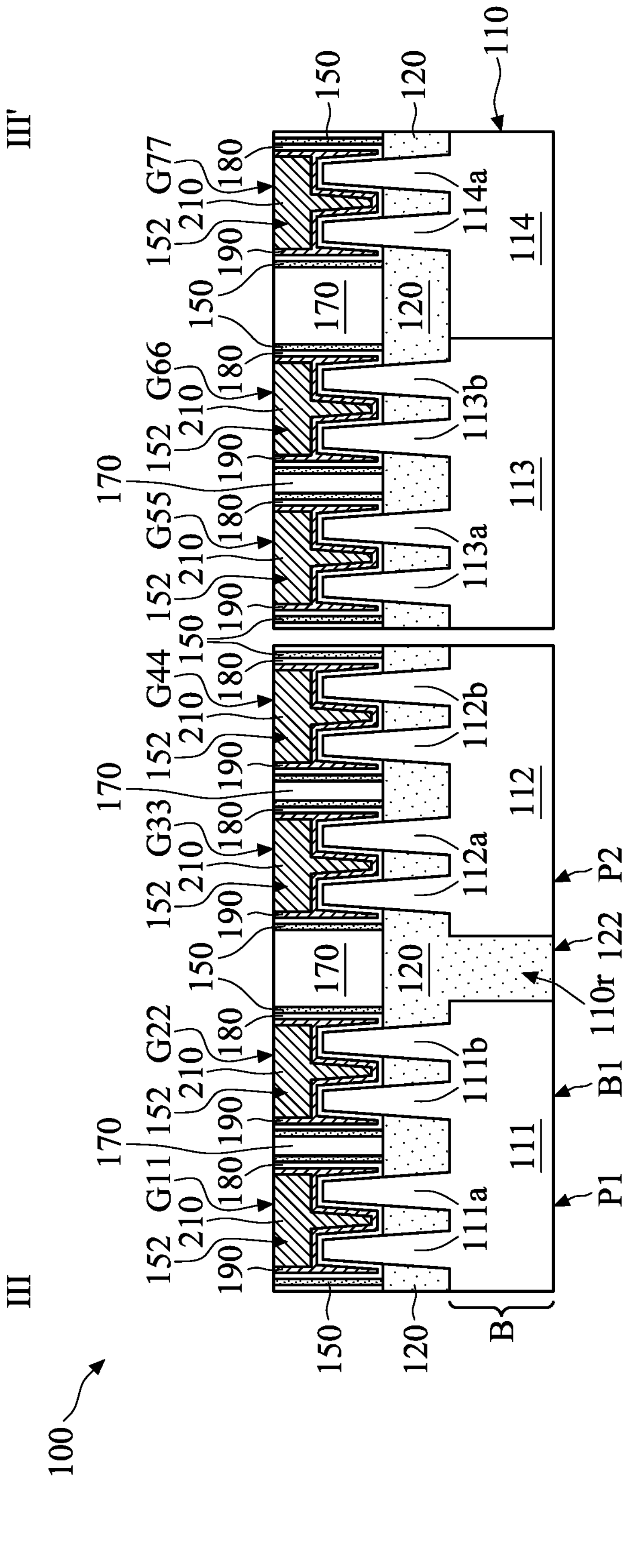

FIGS. 1A-1J are top views of various stages of a process for forming a semiconductor device structure, in accordance with some embodiments. FIGS. 1A-1 to 1J-1 are cross-sectional views illustrating the semiconductor device structure along a sectional line I-I' in FIGS. 1A-1J, in accordance with some embodiments.

As shown in FIGS. 1A and 1A-1, a substrate 110 is provided, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors or a combination thereof. In some embodiments, the substrate 110 is a P-type substrate.

In some embodiments, the substrate 110 is a device wafer that includes various device elements. In some embodiments, the various device elements are formed in and/or over the substrate 110. The device elements are not shown in figures for the purpose of simplicity and clarity.

Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, well regions 111, 112, 113 and 114 are formed in the substrate 110, in accordance with some embodiments. There is a boundary B1 between the well regions 111 and 112, in accordance with some embodiments. The well region 111 has a first type conductivity, the well region 112 has a second type conductivity, and the first type conductivity is different from the second type conductivity, in accordance with some embodiments.

The well region 113 has the second type conductivity, the well region 114 has the first type conductivity, in accordance with some embodiments. In some embodiments, the first type conductivity includes a P-type conductivity, and the second type conductivity includes an N-type conductivity.

The well regions 111 and 114 are P-type well regions, in accordance with some embodiments. The well regions 111 and 114 are doped with P-type dopants, in accordance with some embodiments. The P-type dopants include the Group IIIA element, in accordance with some embodiments.

The Group IIIA element includes boron or another suitable material. In some embodiments, a concentration of the P-type dopants in the well regions 111 and 114 ranges from about 1E12 atoms/$cm^3$ to about 1E14 atoms/$cm^3$.

The well regions 112 and 113 are between the well regions 111 and 114, in accordance with some embodiments. The well regions 112 and 113 are N-type well regions, in accordance with some embodiments. The well regions 112 and 113 are doped with N-type dopants, in accordance with some embodiments.

The N-type dopants include the Group VA element, in accordance with some embodiments. The Group VA element includes phosphor (P), antimony (Sb), or another suitable Group VA material. In some embodiments, a concentration of the N-type dopants in the well regions 112 and 113 ranges from about 1E12 atoms/$cm^3$ to about 1E14 atoms/$cm^3$.

As shown in FIGS. 1A and 1A-1, the substrate 110 has a bottom portion 115, in accordance with some embodiments. The bottom portion 115 is under the well regions 111, 112, 113, and 114, in accordance with some embodiments. The bottom portion 115 may have a P-type conductivity, in accordance with some embodiments.

The bottom portion 115 is doped with P-type dopants, in accordance with some embodiments. The P-type dopants include the Group IIIA element, in accordance with some embodiments. The Group IIIA element includes boron or another suitable material.

As shown in FIGS. 1B and 1B-1, the substrate 110 is partially removed to form trenches 110*t* in the substrate 110, in accordance with some embodiments. After the removal process, the substrate 110 has fins 111*a*, 111*b*, 112*a*, 112*b*, 113*a*, 113*b*, and 114*a* and a base B, in accordance with some embodiments.

The fins 111*a*, 111*b*, 112*a*, 112*b*, 113*a*, 113*b*, and 114*a* are between the trenches 110*t*, in accordance with some embodiments. The fins 111*a*, 111*b*, 112*a*, 112*b*, 113*a*, 113*b*, and 114*a* are formed over the base B, in accordance with some embodiments.

The fins 111*a*, 111*b*, 112*a*, 112*b*, 113*a*, 113*b*, and 114*a* are formed in the well regions 111, 112, 113, and 114 respectively, in accordance with some embodiments. The fins 111*a*, 111*b*, 112*a*, 112*b*, 113*a*, 113*b*, and 114*a* are spaced apart from each other, in accordance with some embodiments.

As shown in FIGS. 1B-1, 1C, and 1C-1, portions of the base B in the well regions 111 and 112 are removed, in accordance with some embodiments. The removed portions of the base B are adjacent to the boundary B1 between the well regions 111 and 112, in accordance with some embodiments. The removal process forms a trench 110*r* in the base B, in accordance with some embodiments.

The trench 110*r* is between the fins 111*b* and 112*a*, in accordance with some embodiments. The trench 110*r* is between the well regions 111 and 112, in accordance with some embodiments. The trench 110*r* separates the well region 111 from the well region 112, in accordance with some embodiments.

Each trench 110*t* has a depth D1 ranging from about 50 nm to about 150 nm, in accordance with some embodiments. If the depth D1 is less than 50 nm, the channel region, which is formed in the fins 111*b* and 112*a*, may be too small to efficiently transport carriers (e.g., electrons or holes).

The fins 111*a*, 112*b*, 113*b*, and 114*a* are used as pick-up elements, which are electrically connected to the well regions 111, 112, 113, and 114 respectively, in accordance with some embodiments. If the depth D1 is greater than 150 nm, the resistance of the fins 111*a*, 112*b*, 113*b*, and 114*a* may be too large, which may adversely affect the electrical performance of the semiconductor device structure with the fins 111*a*, 112*b*, 113*b*, and 114*a*.

The trenches 110*r* and 110*t* together form a trench 110*a*, in accordance with some embodiments. The trench 110*a* has a depth D2 ranging from about 50 nm to about 1.5 μm, in accordance with some embodiments. If the depth D2 is less than 50 nm, the channel region, which is formed in the fins 111*b* and 112*a*, may be too small to efficiently transport carriers (e.g., electrons or holes). In some embodiments, a width W110*r* of the trench 110*r* of the base B is less than a distance D3 between the fins 111*b* and 112*a*.

As shown in FIGS. 1D and 1D-1, an isolation layer 120 is formed over the base B and in the trench 110*r*, in accordance with some embodiments. The fins 111*a*, 111*b*, 112*a*, 112*b*, 113*a*, 113*b*, and 114*a* are partially in the isolation layer 120, in accordance with some embodiments.

The isolation layer 120 includes oxide (such as silicon oxide), in accordance with some embodiments. The isolation layer 120 is formed by a chemical vapor deposition (CVD) process and an etching back process, in accordance with some embodiments.

FIG. 1E-2 is a cross-sectional view illustrating the semiconductor device structure along a sectional line II-II' in FIG. 1E, in accordance with some embodiments. As shown in FIGS. 1E, 1E-1, and 1E-2, gate stacks G1, G2, G3, G4, G5, G6, and G7 are formed over the substrate 110 and the isolation layer 120, in accordance with some embodiments.

The gate stack G1 is over and wrapped around upper portions of the fins 111*a*, in accordance with some embodiments. The gate stack G2 is over and wrapped around upper portions of the fins 111*b*, in accordance with some embodiments. The gate stack G3 is over and wrapped around upper portions of the fins 112*a*, in accordance with some embodiments.

The gate stack G4 is over and wrapped around upper portions of the fins 112*b*, in accordance with some embodiments. The gate stack G5 is over and wrapped around upper portions of the fins 113*a*, in accordance with some embodiments. The gate stack G6 is over and wrapped around upper portions of the fins 113*b*, in accordance with some embodiments.

The gate stack G7 is over and wrapped around upper portions of the fins 114*a*, in accordance with some embodiments. Each of the gate stack G1, G2, G3, G4, G5, G6, or G7 has a gate dielectric layer 130 and a gate electrode 140 over the gate dielectric layer 130, in accordance with some embodiments.

The gate dielectric layer 130 is positioned between the gate electrode 140 and the fins 111*a*, 111*b*, 112*a*, 112*b*, 113*a*, 113*b*, and 114*a*, in accordance with some embodiments. The gate dielectric layer 130 is also positioned between the gate electrode 140 and the isolation layer 120, in accordance with some embodiments.

The gate dielectric layer 130 is made of oxides such as silicon oxide, in accordance with some embodiments. The gate dielectric layer 130 is formed using a chemical vapor deposition process (CVD process) and an etching process, in accordance with some embodiments.

The gate electrode 140 is made of a semiconductor material such as polysilicon, in accordance with some embodiments. The gate electrode 140 is formed using a chemical vapor deposition process and an etching process, in accordance with some embodiments.

As shown in FIGS. 1E, 1E-1, and 1E-2, a spacer layer 150 is formed over sidewalls S of the gate stacks G1, G2, G3, G4, G5, G6, and G7, in accordance with some embodiments. The spacer layer 150 surrounds the gate stacks G1, G2, G3, G4, G5, G6, and G7, in accordance with some embodiments. The spacer layer 150 is positioned over the fins 111*a*, 111*b*, 112*a*, 112*b*, 113*a*, 113*b*, and 114*a* and the isolation layer 120, in accordance with some embodiments.

The spacer layer 150 includes insulating materials, such as silicon oxide, silicon nitride, silicon oxynitride, or silicon carbide, in accordance with some embodiments. The formation of the spacer layer 150 includes a deposition process and an anisotropic etching process, in accordance with some embodiments. The anisotropic etching process includes a dry etching process, in accordance with some embodiments.

FIG. 1F-2 is a cross-sectional view illustrating the semiconductor device structure along a sectional line II-II' in FIG. 1F, in accordance with some embodiments. As shown in FIGS. 1F, 1F-1, and 1F-2, portions of the fins 111*a*, 111*b*, 112*a*, 112*b*, 113*a*, 113*b*, and 114*a*, which are not covered by the gate stacks G1, G2, G3, G4, G5, G6, and G7 and the spacer layer 150, are removed to form recesses R1, R2, R3, R4, R5, R6, and R7 in the fins 111a, 111b, 112a, 112b, 113a, 113b, and 114a respectively, in accordance with some embodiments. The removal process includes an etching process, in accordance with some embodiments.

As shown in FIGS. 1F, 1F-1, and 1F-2, epitaxial structures 161, 162, 163, 164, 165, 166, and 167 are formed in the recesses R1, R2, R3, R4, R5, R6, and R7 respectively, in accordance with some embodiments. The epitaxial structures 161, 162, 163, 164, 165, 166, and 167 are partially embedded in the fins 111a, 111b, 112a, 112b, 113a, 113b, and 114a respectively, in accordance with some embodiments. The epitaxial structures 161, 162, 163, 164, 165, 166, and 167 are in direct contact with the fins 111a, 111b, 112a, 112b, 113a, 113b, and 114a respectively, in accordance with some embodiments.

The epitaxial structures 161 are positioned on two opposite sides of the gate stack G1, in accordance with some embodiments. The epitaxial structures 162 are positioned on two opposite sides of the gate stack G2, in accordance with some embodiments. The epitaxial structures 163 are positioned on two opposite sides of the gate stack G3, in accordance with some embodiments.

The epitaxial structures 164 are positioned on two opposite sides of the gate stack G4, in accordance with some embodiments. The epitaxial structures 165 are positioned on two opposite sides of the gate stack G5, in accordance with some embodiments.

The epitaxial structures 166 are positioned on two opposite sides of the gate stack G6, in accordance with some embodiments. The epitaxial structures 167 are positioned on two opposite sides of the gate stack G7, in accordance with some embodiments.

The epitaxial structures 161, 163, 165, and 167 have a P-type conductivity, in accordance with some embodiments. The epitaxial structures 162, 164, and 166 have an N-type conductivity, in accordance with some embodiments.

In some embodiments, the epitaxial structures 161, 163, 165, and 167 are made of a P-type conductivity material, in accordance with some embodiments. The P-type conductivity material includes silicon germanium (SiGe) or another suitable P-type conductivity material. The epitaxial structures 161, 163, 165, and 167 are doped with the Group IIIA element, in accordance with some embodiments. The Group IIIA element includes boron or another suitable material.

The epitaxial structures 162, 164, and 166 are made of an N-type conductivity material, in accordance with some embodiments. The N-type conductivity material includes silicon phosphorus (SiP) or another suitable N-type conductivity material. The epitaxial structures 162, 164, and 166 are doped with the Group VA element, in accordance with some embodiments.

The Group VA element includes phosphor (P), antimony (Sb), or another suitable Group VA material. The epitaxial structures 161, 162, 163, 164, 165, 166, and 167 are also referred to as doped structures, in accordance with some embodiments.

The epitaxial structures 161, 163, 165, and 167 are formed using a first epitaxial process, in accordance with some embodiments. The epitaxial structures 162, 164, and 166 are formed using a second epitaxial process, in accordance with some embodiments. The first epitaxial process and the second epitaxial process are performed individually, in accordance with some embodiments.

FIG. 1G-2 is a cross-sectional view illustrating the semiconductor device structure along a sectional line II-II' in FIG. 1G, in accordance with some embodiments. As shown in FIGS. 1G, 1G-1, and 1G-2, a dielectric layer 170 is formed over the isolation layer 120 and the epitaxial structures 161, 162, 163, 164, 165, 166, and 167, in accordance with some embodiments.

The dielectric layer 170 is made of a dielectric material such as silicon oxide, silicon oxynitride, borosilicate glass (BSG), phosphoric silicate glass (PSG), borophosphosilicate glass (BPSG), fluorinated silicate glass (FSG), a low-k material, a porous dielectric material, or a combination thereof, in accordance with some embodiments.

The dielectric layer 170 is formed by a deposition process, such as a chemical vapor deposition (CVD) process, and a planarization process, such as a chemical mechanical polishing (CMP) process, in accordance with some embodiments.

FIG. 1H-2 is a cross-sectional view illustrating the semiconductor device structure along a sectional line II-II' in FIG. 1H, in accordance with some embodiments. As shown in FIGS. 1H, 1H-1, and 1H-2, the gate stacks G1, G2, G3, G4, G5, G6, and G7 are removed, in accordance with some embodiments.

After the removal process, trenches 152 are formed in the spacer layer 150, in accordance with some embodiments. The trenches 152 expose portions of the fins 111a, 111b, 112a, 112b, 113a, 113b, and 114a and the isolation layer 120, in accordance with some embodiments. The removal process includes an etching process such as a wet etching process, in accordance with some embodiments.

FIG. 1I-2 is a cross-sectional view illustrating the semiconductor device structure along a sectional line II-II' in FIG. 1I, in accordance with some embodiments. FIG. 1I-3 is a cross-sectional view illustrating the semiconductor device structure along a sectional line III-III' in FIG. 1I, in accordance with some embodiments.

As shown in FIGS. 1I, 1I-1, 1I-2, and 1I-3, gate stacks G11, G22, G33, G44, G55, G66, and G77 are formed in the trenches 152 of the spacer layer 150 respectively, in accordance with some embodiments. As shown in FIG. 1I-3, the gate stack G11 is over and wrapped around upper portions of the fins 111a, in accordance with some embodiments. The gate stack G22 is over and wrapped around upper portions of the fins 111b, in accordance with some embodiments.

The gate stack G33 is over and wrapped around upper portions of the fins 112a, in accordance with some embodiments. The gate stack G44 is over and wrapped around upper portions of the fins 112b, in accordance with some embodiments. The gate stack G55 is over and wrapped around upper portions of the fins 113a, in accordance with some embodiments.

The gate stack G66 is over and wrapped around upper portions of the fins 113b, in accordance with some embodiments. The gate stack G77 is over and wrapped around upper portions of the fins 114a, in accordance with some embodiments.

Each of the gate stack G11, G22, G33, G44, G55, G66, or G77 has a gate dielectric layer 180, a work function metal layer 190, and a gate electrode 210, in accordance with some embodiments. The gate dielectric layer 180 conformally covers the fins 111a, 111b, 112a, 112b, 113a, 113b, and 114a exposed by the trenches 152, in accordance with some embodiments.

The gate dielectric layer 180 is made of a dielectric material such as silicon oxide, silicon nitride, silicon oxynitride, a high dielectric constant (high-K) material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The work function metal layer 190 is conformally formed over the gate dielectric layer 180, in accordance with some embodiments. In some embodiments, the work function metal layer 190 of the gate stack G22 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In some embodiments, the work function metal layer 190 of the gate stack G33 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or a combination thereof.

In some embodiments, the work function metal layer 190 of G11, G44, G55, G66, and G77 can be an n-type metal. The n-type metal may be made of metal, metal carbide, metal nitride, or a combination thereof. For example, the n-type metal is made of tantalum, tantalum nitride, or a combination thereof.

In some other embodiments, the work function metal layer 190 of G11, G44, G55, G66, and G77 can be a p-type metal. The p-type metal may be made of metal, metal carbide, metal nitride, other suitable materials, or a combination thereof. For example, the p-type metal is made of titanium, titanium nitride, other suitable materials, or a combination thereof.

The gate electrode 210 (also called metal gate electrode) is formed over the work function metal layer 190 to fill the trench 152 of the spacer layer 150, in accordance with some embodiments. The gate electrode 210 is made of a suitable metal material, such as aluminum, tungsten, gold, platinum, cobalt, another suitable metal, an alloy thereof, or a combination thereof, in accordance with some embodiments.

FIG. 1J-2 is a cross-sectional view illustrating the semiconductor device structure along a sectional line II-II' in FIG. 1J, in accordance with some embodiments. FIG. 1J-3 is a cross-sectional view illustrating the semiconductor device structure along a sectional line III-III' in FIG. 1J, in accordance with some embodiments.

As shown in FIGS. I1-3, 1J, 1J-1, and 1J-2, the bottom portion 115 of the base B is removed, in accordance with some embodiments. In this step, a semiconductor device structure 100 is substantially formed, in accordance with some embodiments. After the removal process, the isolation layer 120 passes through the base B, in accordance with some embodiments. As shown in FIGS. 1J-1 and 1J-3, the base B is divided into parts P1 and P2 by the trench 110*r*, in accordance with some embodiments.

The parts P1 and P2 are separated from each other by the isolation layer 120, in accordance with some embodiments. The parts P1 and P2 are electrically insulated from each other by the isolation layer 120, in accordance with some embodiments.

The fins 111*a* and 111*b* are over the part P1, in accordance with some embodiments. The fins 112*a* and 112*b* are over the part P2, in accordance with some embodiments. The fins 111*a* and 111*b* are electrically insulated from the fins 112*a* and 112*b*, in accordance with some embodiments.

The removal process includes thinning the base B from the bottom surface B1 of the base B, in accordance with some embodiments. The removal process includes a planarization process such as a chemical mechanical polishing process, in accordance with some embodiments. Therefore, as shown in FIGS. 1J-1 and 1J-3, after the removal process, the bottom surface B1 of the base B is substantially level with a bottom surface 122 of the isolation layer 120, in accordance with some embodiments.

The epitaxial structures 162 and 163 are also referred to as source/drain structures, in accordance with some embodiments. As shown in FIG. 1J, the gate stack G22 and the epitaxial structures 162 together form a transistor TR1, in accordance with some embodiments. The transistor TR1 includes an N-type field effect transistor (NFET), in accordance with some embodiments.

The gate stack G33 and the epitaxial structures 163 together form a transistor TR2, in accordance with some embodiments. The transistor TR2 includes an P-type field effect transistor (PFET), in accordance with some embodiments. The transistors TR1 and TR2 together form a complementary metal-oxide-semiconductor field-effect transistor (CMOS FET), in accordance with some embodiments.

The epitaxial structures 161 are used as pick-up electrodes, which are electrically connected to the fins 111*a* and the well region 111, in accordance with some embodiments. The epitaxial structures 161 and the well region 111 have the same type conductivity such as P-type conductivity, in accordance with some embodiments.

The epitaxial structures 164 are used as pick-up electrodes, which are electrically connected to the fins 112*b* and the well region 112, in accordance with some embodiments. The epitaxial structures 164 and the well region 112 have the same type conductivity such as N-type conductivity, in accordance with some embodiments.

The isolation layer 120 (or the trench 110*r*) separates the well region 111 from the well region 112, which prevents the formation of the parasitic NPN bipolar junction transistor (BJT) and the parasitic PNP bipolar junction transistor in the well regions 111 and 112, in accordance with some embodiments. Therefore, the performance of the semiconductor device structure 100 is improved, in accordance with some embodiments.

As shown in FIGS. 1J and 1J-1, the epitaxial structures 165 and the well regions 113 and 114 together form a bipolar junction transistor (BJT) 220, in accordance with some embodiments. The bipolar junction transistor 220 includes a PNP bipolar junction transistor, in accordance with some embodiments.

The epitaxial structures 166 are used as pick-up electrodes, which are electrically connected to the fins 113*b* and the well region 113, in accordance with some embodiments. The epitaxial structures 166 and the well region 113 have the same type conductivity such as N-type conductivity, in accordance with some embodiments.

The epitaxial structures 167 are used as pick-up electrodes, which are electrically connected to the fins 114*a* and the well region 114, in accordance with some embodiments. The epitaxial structures 167 and the well region 114 have the same type conductivity such as P-type conductivity, in accordance with some embodiments.

Figure 2A:
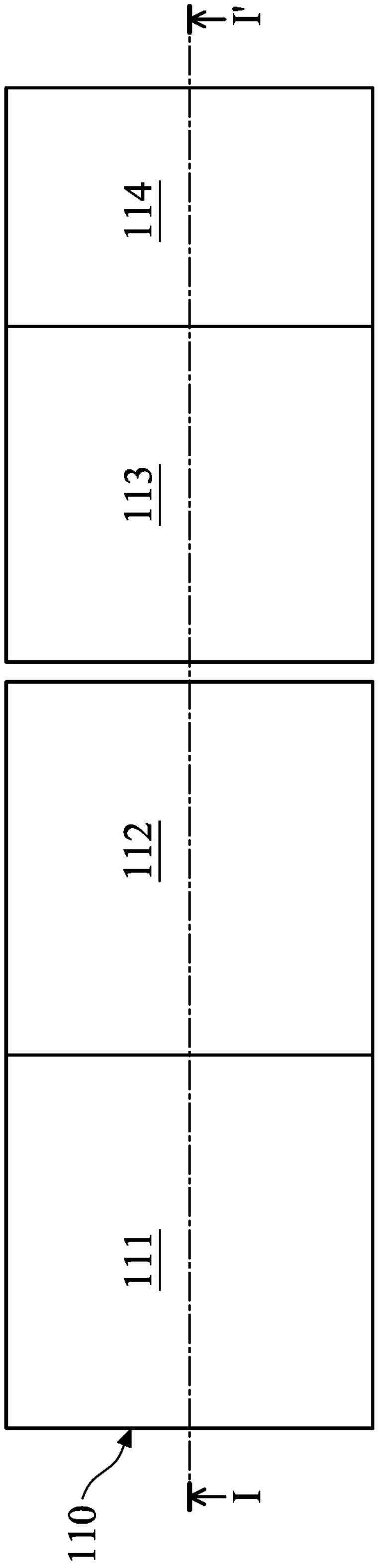
FIGS. 2A-2D are top views of various stages of a process for forming a semiconductor device structure, in accordance with some embodiments.
Figures 1, 2A:
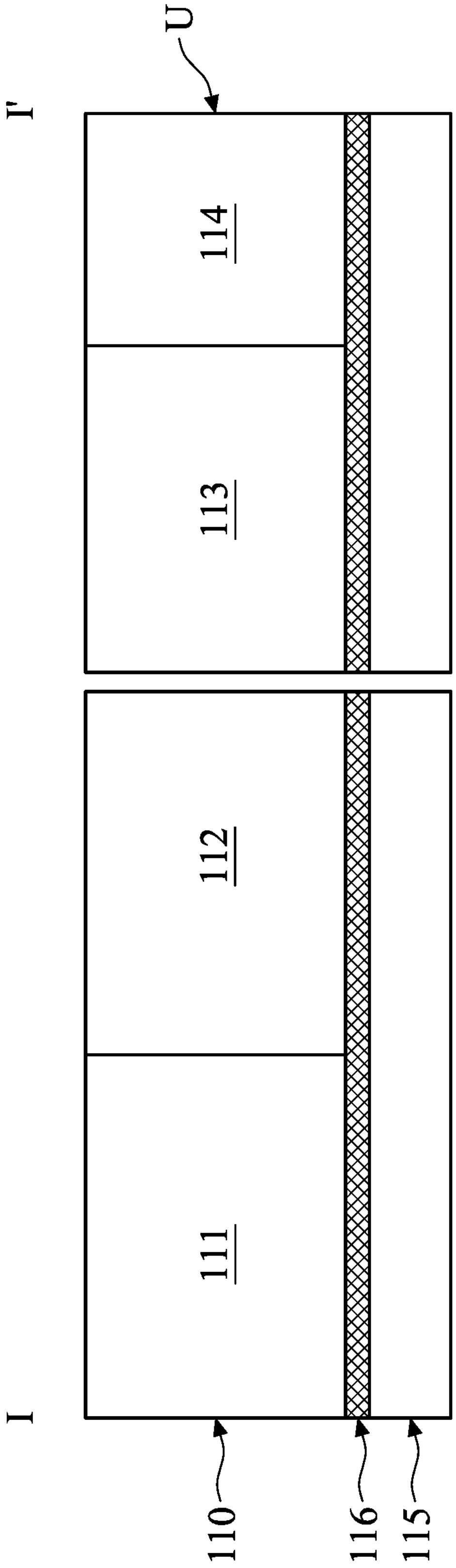
Figure 2B:
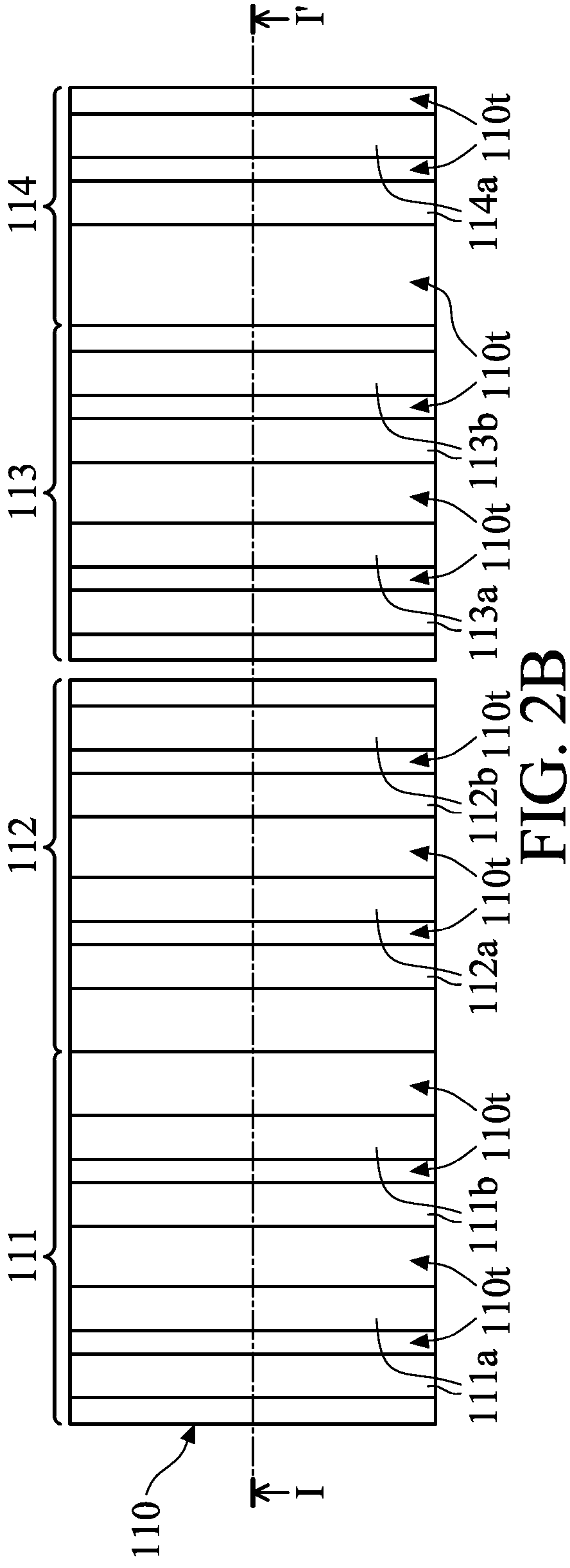
Figures 1, 2B:
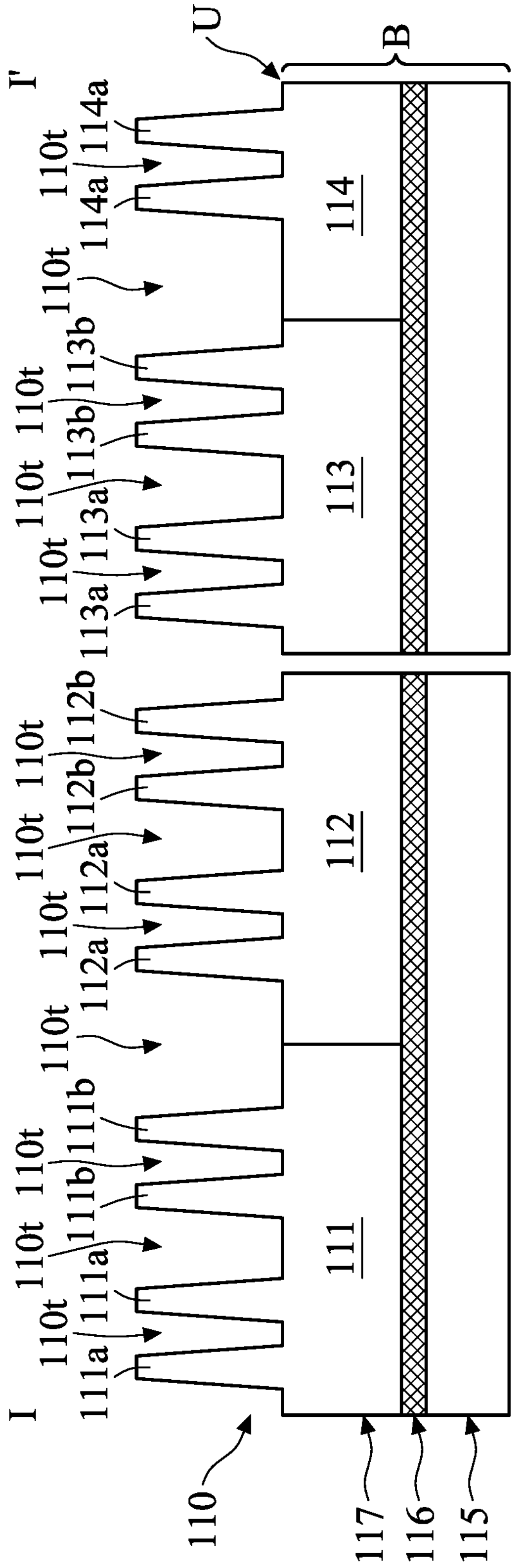
Figure 2C:
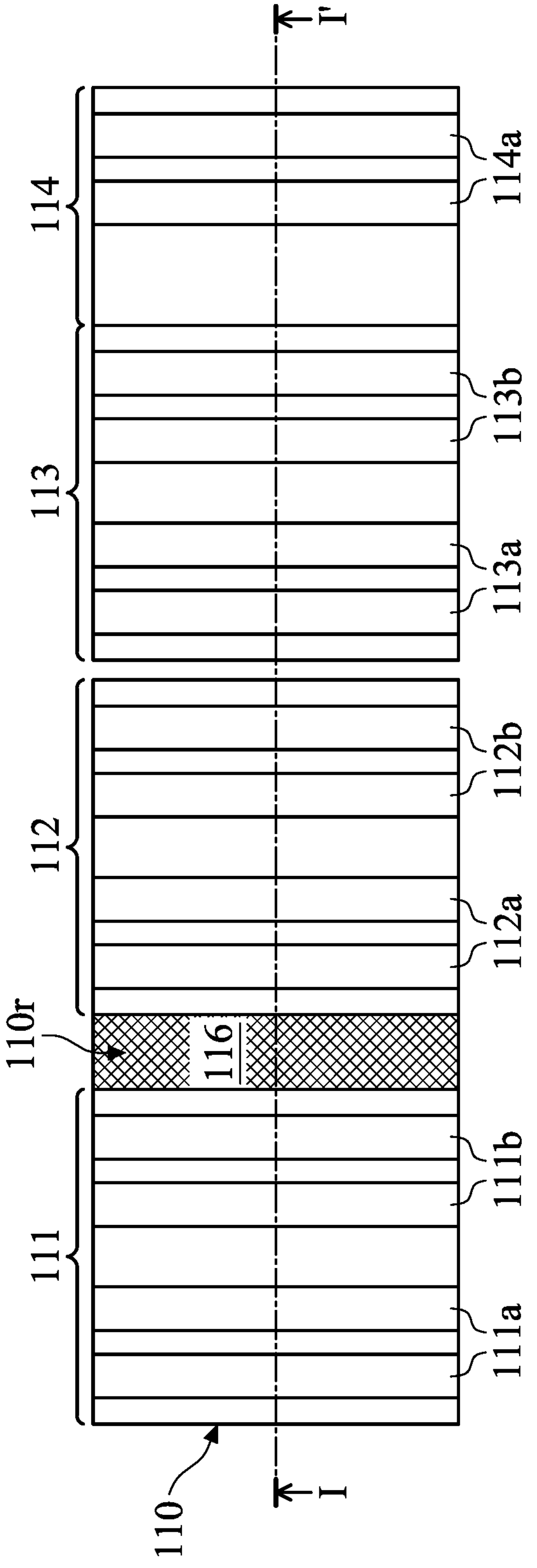
Figures 1, 2C:
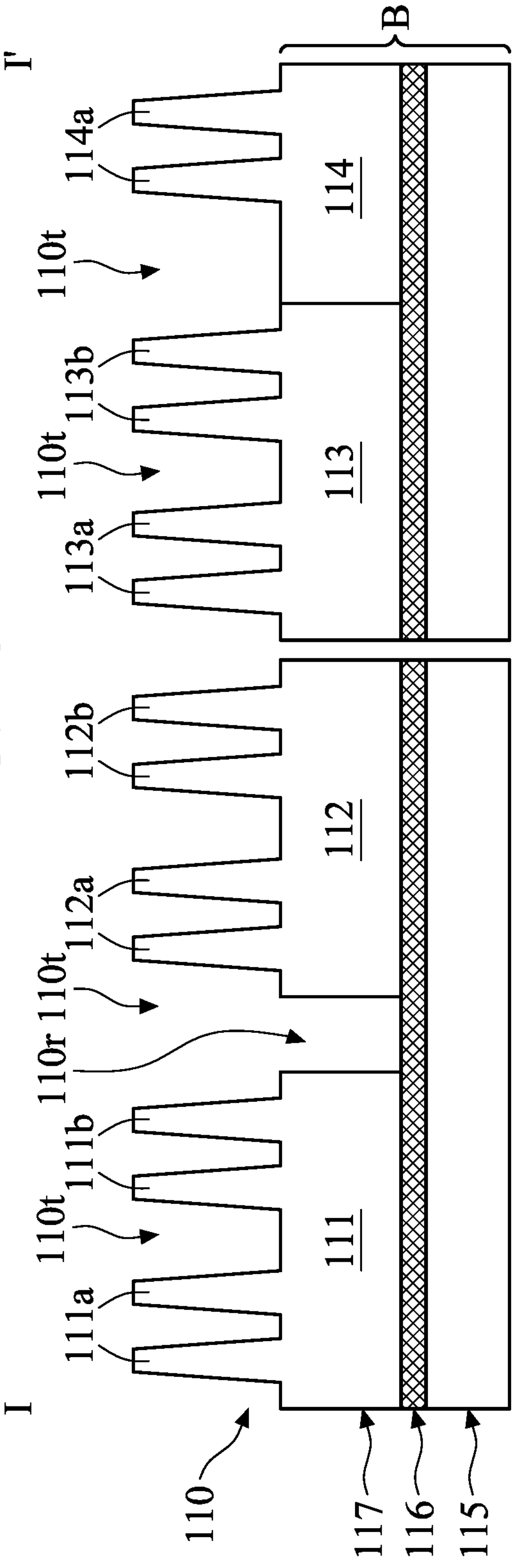
Figure 2D:
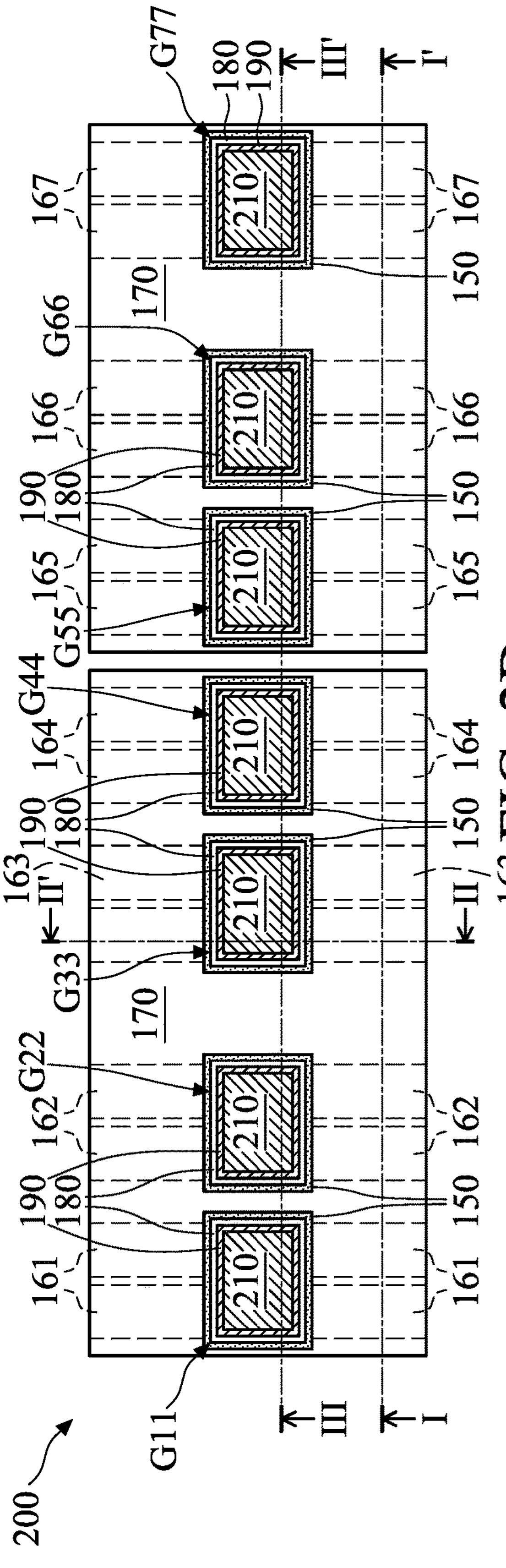
Figures 1, 2D:
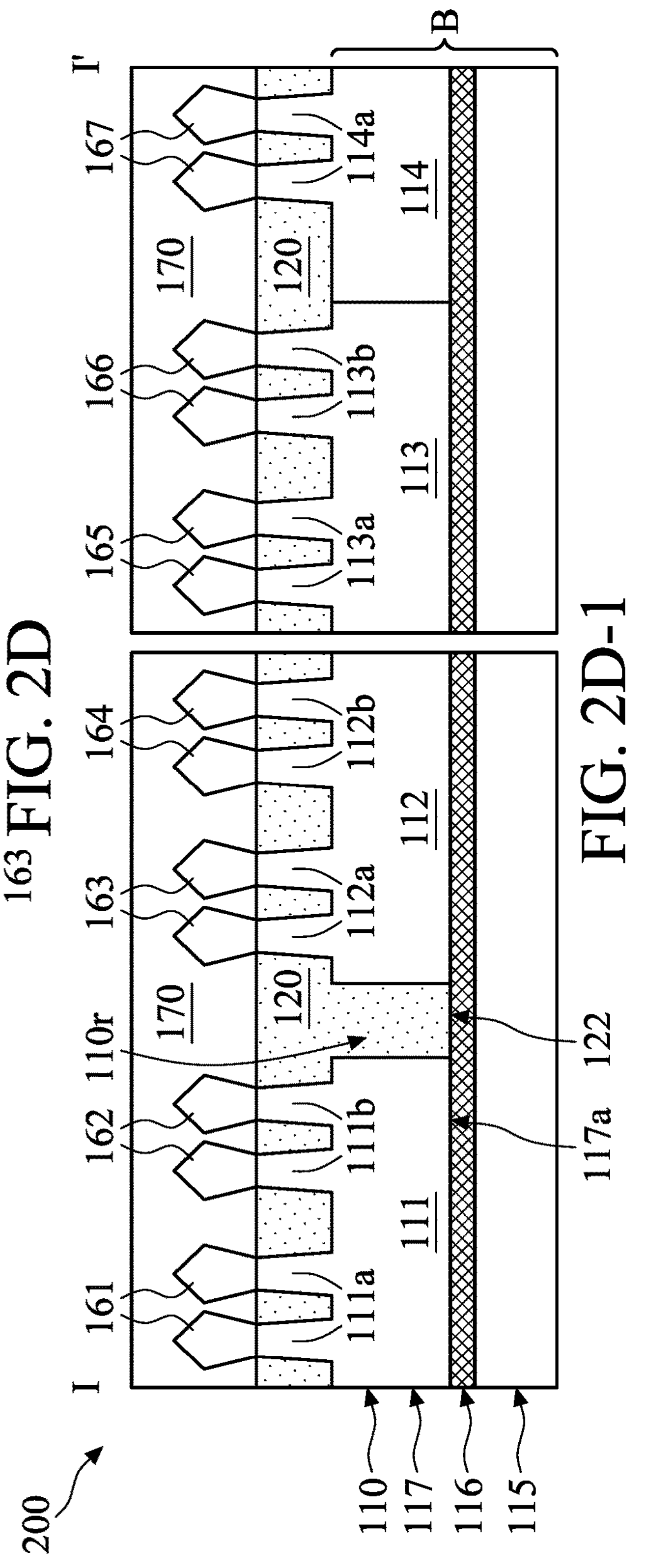
Figures 2, 2D:
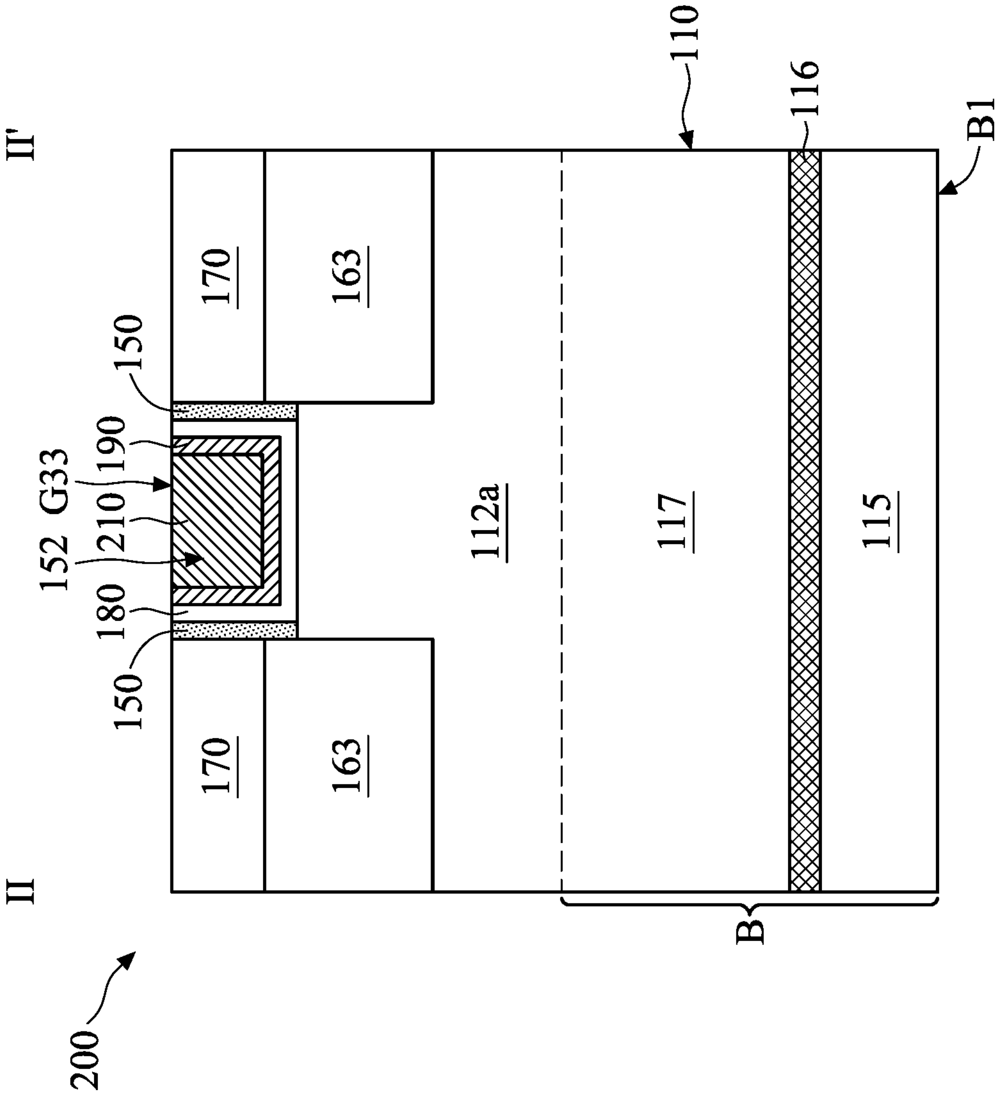
Figures 2, 2D, 3:
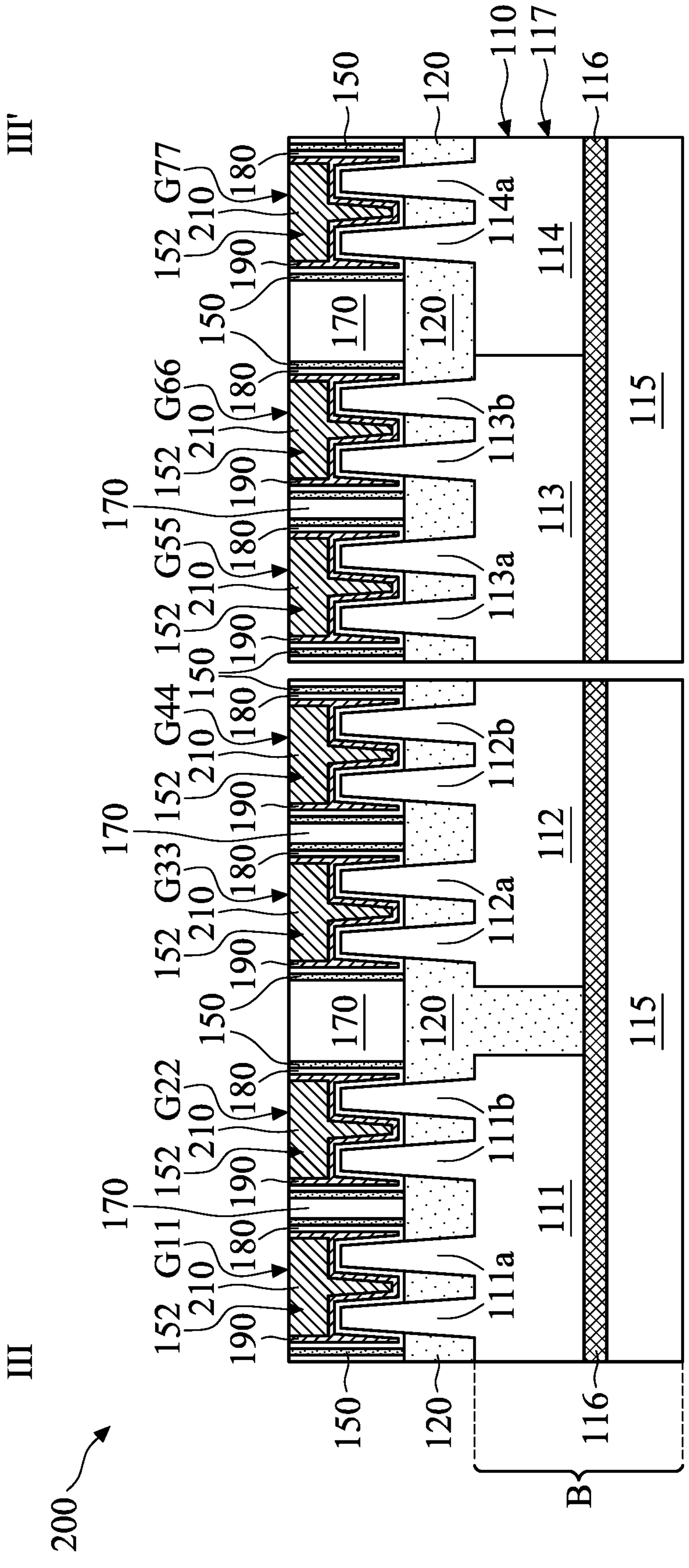

FIGS. 2A-2D are top views of various stages of a process for forming a semiconductor device structure, in accordance with some embodiments. FIGS. 2A-1 to 2D-1 are cross-sectional views illustrating the semiconductor device structure along a sectional line I-I' in FIGS. 2A-2D, in accordance with some embodiments.

As shown in FIGS. 2A and 2A-1, a substrate 110 is provided, in accordance with some embodiments. The substrate 110 of FIGS. 2A and 2A-1 is similar to the substrate 110 of FIGS. 1A and 1A-1, except that the substrate 110 of FIGS. 2A and 2A-1 further includes an insulating layer 116, in accordance with some embodiments. The substrate 110 includes a semiconductor-on-insulator (SOI) substrate such as a silicon-on-insulator substrate or a germanium-on-insulator substrate, in accordance with some embodiments.

As shown in FIGS. 2A and 2A-1, the step of FIG. 1A is performed to form well regions 111, 112, 113 and 114 in an upper portion U of the substrate 110 over the insulating layer 116, in accordance with some embodiments. The insulating layer 116 is between the well regions 111, 112, 113 and 114 and the bottom portion 115, in accordance with some embodiments. The insulating layer 116 is made of insulating materials, such as silicon oxide, silicon nitride, silicon oxynitride, or silicon carbide, in accordance with some embodiments.

As shown in FIGS. 2B and 2B-1, the step of FIGS. 1B and 1B-1 is performed to form trenches 110*t* in the upper portion U of the substrate 110, in accordance with some embodiments. After the removal process, the substrate 110 has fins 111*a*, 111*b*, 112*a*, 112*b*, 113*a*, 113*b*, and 114*a* and a base B, in accordance with some embodiments.

The fins 111*a*, 111*b*, 112*a*, 112*b*, 113*a*, 113*b*, and 114*a* are between the trenches 110*t*, in accordance with some embodiments. The fins 111*a*, 111*b*, 112*a*, 112*b*, 113*a*, 113*b*, and 114*a* are formed over the base B, in accordance with some embodiments.

The base B has the bottom portion 115, the insulating layer 116, and an upper layer 117, in accordance with some embodiments. The insulating layer 116 is between the bottom portion 115 and the upper layer 117, in accordance with some embodiments.

As shown in FIGS. 2C and 2C-1, a trench 110*r* is formed in the upper layer 117, in accordance with some embodiments. The trench 110*r* passes through the upper layer 117, in accordance with some embodiments. The trench 110*r* exposes a portion of the insulating layer 116, in accordance with some embodiments.

The trench 110*r* is between the fins 111*b* and 112*a* and between the well regions 111 and 112, in accordance with some embodiments. The fins 111*b* are electrically insulated from the fins 112*a*, in accordance with some embodiments. The well region 111 is electrically insulated from the well region 112, in accordance with some embodiments.

FIG. 2D-2 is a cross-sectional view illustrating the semiconductor device structure along a sectional line II-II' in FIG. 2D, in accordance with some embodiments. FIG. 2D-3 is a cross-sectional view illustrating the semiconductor device structure along a sectional line III-III' in FIG. 2D, in accordance with some embodiments.

As shown in FIGS. 2D, 2D-1, 2D-2, and 2D-3, the steps of FIGS. 1D-1I are performed to form the isolation layer 120, the spacer layer 150, the epitaxial structures 161, 162, 163, 164, 165, 166, and 167, the dielectric layer 170, and the gate stacks G11, G22, G33, G44, G55, G66, and G77, in accordance with some embodiments. In this step, a semiconductor device structure 200 is substantially formed, in accordance with some embodiments.

The isolation layer 120 passes through the upper layer 117, in accordance with some embodiments. The isolation layer 120 is in direct contact with the insulating layer 116, in accordance with some embodiments. In some embodiments, a bottom surface 122 of the isolation layer 120 is substantially level with a bottom surface 117*a* of the upper layer 117.

In some other embodiments, the substrate 110 is an N-type substrate, in accordance with some embodiments. The bottom portion 115 of the substrate 110 has the N-type conductivity, in accordance with some embodiments.

The well regions 111 and 114 and the epitaxial structures 161, 163, 165, and 167 have an N-type conductivity, in accordance with some embodiments. The well regions 112 and 113 and the epitaxial structures 162, 164, and 166 have a P-type conductivity, in accordance with some embodiments.

The epitaxial structures 161, 163, 165, and 167 are made of an N-type conductivity material, in accordance with some embodiments. The N-type conductivity material includes silicon phosphorus (SiP) or another suitable N-type conductivity material.

The epitaxial structures 161, 163, 165, and 167 are doped with the Group VA element, in accordance with some embodiments. The Group VA element includes phosphor (P), antimony (Sb), or another suitable Group VA material. The epitaxial structures 161, 163, 165, and 167 are also referred to as doped structures, in accordance with some embodiments.

In some other embodiments, the epitaxial structures 162, 164, and 166 are made of a P-type conductivity material, in accordance with some embodiments. The P-type conductivity material includes silicon germanium (SiGe) or another suitable P-type conductivity material. The epitaxial structures 162, 164, and 166 are doped with the Group IIIA element, in accordance with some embodiments. The Group IIIA element includes boron or another suitable material.

In still other embodiments, the well regions 111 and 112 have the same type conductivity such as P-type conductivity or N-type conductivity.

Processes and materials for forming the semiconductor device structure 200 may be similar to, or the same as, those for forming the semiconductor device structure 100 described above. Elements designated by the same or similar reference numbers as those in FIGS. 1A to 2D-3 have the same or similar structures and the materials. Therefore, the detailed descriptions thereof will not be repeated herein.

In accordance with some embodiments, semiconductor device structures and methods for forming the same are provided. The methods (for forming the semiconductor device structure) form a trench between a first well region and a second well region to electrically insulate the first well region from the second well region. Therefore, the trench may prevent the formation of the parasitic NPN bipolar junction transistor and the parasitic PNP bipolar junction transistor in the first well region and the second well region. As a result, the performance of the semiconductor device structure is improved.

In accordance with some embodiments, a method for forming a semiconductor device structure is provided. The method includes providing a substrate having a base, a first fin, and a second fin over the base. The method includes forming a first trench in the base and between the first fin and the second fin. The method includes forming an isolation layer over the base and in the first trench. The first fin and the second fin are partially in the isolation layer. The method includes forming a first gate stack over the first fin and the isolation layer. The method includes forming a second gate stack over the second fin and the isolation layer. The method includes removing a bottom portion of the base. The isolation layer passes through the base after the bottom portion of the base is removed.

In accordance with some embodiments, a method for forming a semiconductor device structure is provided. The method includes providing a substrate having a base, a first fin, and a second fin over the base. The base has a bottom portion, an insulating layer, and an upper layer, and the insulating layer is between the bottom portion and the upper layer. The method includes forming a trench in the upper layer and between the first fin and the second fin. The trench exposes a portion of the insulating layer. The method includes forming an isolation layer over the base and in the trench. The first fin and the second fin are partially in the isolation layer. The method includes forming a first gate stack over the first fin and the isolation layer. The method includes forming a second gate stack over the second fin and the isolation layer.

In accordance with some embodiments, a semiconductor device structure is provided. The semiconductor device structure includes a substrate having a base, a first fin, and a second fin. The base has a first part and a second part, the first fin and the second fin are over the first part and the second part respectively, and the first fin and the second fin are electrically insulated from each other. The semiconductor device structure includes an isolation layer over the base and extends into the base. The first fin and the second fin are partially in the isolation layer, and the isolation layer separates the first part from the second part. The semiconductor device structure includes a first gate stack over the first fin and the isolation layer. The semiconductor device structure includes a second gate stack over the second fin and the isolation layer. The first gate stack is spaced apart from the second gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
- providing a substrate having a base, a first fin, a second fin, and a third fin over the base;
- forming a first trench in the base and between the first fin and the second fin;
- forming an isolation layer over the base and in the first trench, wherein the first fin, the second fin, and the third fin are partially in the isolation layer;
- forming a first gate stack over the first fin, the third fin, and the isolation layer, wherein forming the first gate stack comprises forming a gate dielectric layer overlying an uppermost surface of the isolation layer;
- forming a second gate stack over the second fin and the isolation layer; and
- removing a bottom portion of the base while maintaining a first top portion of the base coupled to the first fin and the third fin and a second top portion of the base coupled to the second fin, wherein the isolation layer passes between the first top portion and the second top portion after the bottom portion of the base is removed.

2. The method for forming the semiconductor device structure as claimed in claim 1, wherein removing the bottom portion of the base comprises:
- thinning the base from a bottom surface of the base.

3. The method for forming the semiconductor device structure as claimed in claim 1, wherein the first top portion and the second top portion are separated from each other by the isolation layer after the bottom portion of the base is removed.

4. The method for forming the semiconductor device structure as claimed in claim 1, wherein a first bottom surface of the first top portion of the base is substantially level with a second bottom surface of the isolation layer after the bottom portion of the base is removed.

5. The method for forming the semiconductor device structure as claimed in claim 1, wherein the base is divided into the first top portion and the second top portion by the first trench, and the first top portion and the second top portion are electrically insulated from each other by the isolation layer after the bottom portion of the base is removed.

6. The method for forming the semiconductor device structure as claimed in claim 1, wherein the substrate has a first well region and a second well region, the first fin and a first portion of the base is in the first well region, the second fin and a second portion of the base is in the second well region, and forming the first trench comprises:
- partially removing the first portion and the second portion of the base to form the first trench between the first well region and the second well region, wherein the first trench separates the first well region from the second well region.

7. The method for forming the semiconductor device structure as claimed in claim 6, wherein the first well region has a first type conductivity, the second well region has a second type conductivity, and the first type conductivity is different from the second type conductivity.

8. The method for forming the semiconductor device structure as claimed in claim 6, wherein the bottom portion of the base of the substrate is under the first well region and the second well region.

9. The method for forming the semiconductor device structure as claimed in claim 1, wherein a width of the first trench of the base is less than a distance between the first fin and the second fin.

10. The method for forming the semiconductor device structure as claimed in claim 1, further comprising:
- before forming the first gate stack over the first fin, the third fin, and the isolation layer, forming a dielectric layer over the first fin, the second fin, the third fin, and the isolation layer, wherein the dielectric layer has a second trench and a third trench, the second trench partially exposes the first fin and the isolation layer, the third trench partially exposes the second fin and the isolation layer, and the first gate stack and the second gate stack are formed in the second trench and the third trench respectively.

11. The method of claim 1, wherein forming the isolation layer comprises forming the isolation layer to interface with a sidewall of the first fin.

12. A method for forming a semiconductor device structure, comprising:
- providing a substrate having a base, a first fin, and a second fin over the base, wherein the base has a bottom portion, an insulating layer, and an upper layer, and the insulating layer is between the bottom portion and the upper layer;
- forming a trench in the upper layer and between the first fin and the second fin, wherein:
  - the trench exposes a portion of the insulating layer, and a bottom of the trench is defined by a top surface of the insulating layer;

forming an isolation layer over the base and in the trench, wherein the first fin and the second fin are partially in the isolation layer;

forming a first gate stack over the first fin and the isolation layer, wherein forming the first gate stack comprises forming a gate dielectric layer overlying an uppermost surface of the isolation layer; and forming a second gate stack over the second fin and the isolation layer.

13. The method for forming the semiconductor device structure as claimed in claim 12, wherein the isolation layer is in direct contact with the top surface of the insulating layer.

14. The method for forming the semiconductor device structure as claimed in claim 12, wherein a first bottom surface of the isolation layer is substantially level with a second bottom surface of the upper layer.

15. The method for forming the semiconductor device structure as claimed in claim 12, wherein the first fin is electrically insulated from the second fin after the trench is formed in the upper layer and between the first fin and the second fin.

16. The method for forming the semiconductor device structure as claimed in claim 12, wherein the isolation layer passes through the upper layer of the base of the substrate.

17. A method for forming a semiconductor device structure, comprising:

forming an isolation layer between a first fin and a second fin;

forming a dielectric layer between the first fin and the second fin and overlying the isolation layer;

forming a first gate stack over first fin;

forming a second gate stack over the second fin and spaced apart from the first gate stack by the dielectric layer; and removing at least a portion of a base underlying the first fin and the second fin after forming the second gate stack to expose a surface of the isolation layer facing away from the dielectric layer, wherein;

the base comprises a bottom portion, an insulating layer, and an upper layer separated from the bottom portion by the insulating layer, removing at least the portion of the base comprises removing the bottom portion and the insulating layer, and the first fin and the second fin remain concealed by a remaining portion of the base after removing the portion of the base.

18. The method of claim 17, wherein the base comprises a substrate, and removing at least the portion of the base comprises removing at least a portion of the substrate.

19. The method of claim 17, wherein forming the isolation layer comprises forming the isolation layer between the first fin and a third fin, wherein a thickness of the isolation layer between the first fin and the second fin is different than a thickness of the isolation layer between the first fin and the third fin.

20. The method of claim 19, wherein forming the isolation layer comprises forming the isolation layer such that the thickness of the isolation layer between the first fin and the second fin is greater than the thickness of the isolation layer between the first fin and the third fin.

* * * * *